(12) United States Patent
Kim et al.

(10) Patent No.: US 11,804,530 B2
(45) Date of Patent: Oct. 31, 2023

(54) SEMICONDUCTOR DEVICE AND METHOD OF FABRICATING THE SAME

(71) Applicant: Samsung Electronics Co., Ltd., Suwon-si (KR)

(72) Inventors: Munhyeon Kim, Hwaseong-si (KR); Myung Gil Kang, Suwon-si (KR); Wandon Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 162 days.

(21) Appl. No.: 17/245,601

(22) Filed: Apr. 30, 2021

(65) Prior Publication Data

US 2022/0109057 A1   Apr. 7, 2022

(30) Foreign Application Priority Data

Oct. 5, 2020   (KR) ........................ 10-2020-0128176

(51) Int. Cl.
*H01L 29/423*   (2006.01)
*H01L 29/06*   (2006.01)
(Continued)

(52) U.S. Cl.
CPC .... *H01L 29/42364* (2013.01); *H01L 29/0653* (2013.01); *H01L 29/42368* (2013.01);
(Continued)

(58) Field of Classification Search
CPC ......... H01L 29/78696; H01L 29/42364; H01L 29/42392; H01L 27/092; H01L 29/42368; H01L 29/4908; H01L 29/0653
See application file for complete search history.

(56) References Cited

U.S. PATENT DOCUMENTS 8,900,951 B1   12/2014   Cheng et al.
9,443,856 B2   9/2016   Ching et al.
(Continued)

FOREIGN PATENT DOCUMENTS

| CN | 106328520 A | 1/2017 |
| DE | 102018116726 A1 | 5/2019 |
| WO | WO-2020/129571 A1 | 6/2020 |

OTHER PUBLICATIONS

Alfredo Mameli et al., 'Area-Selective Atomic Layer Deposition of $SiO_2$ Using Acetylacetone as a Chemoselective Inhibitor in an ABC-Type Cycle' *ACS Nano*, vol. 11, 2017, pp. 9303-9311.
(Continued)

*Primary Examiner* — Changhyun Yi
(74) *Attorney, Agent, or Firm* — Harness, Dickey & Pierce, P.L.C.

(57) ABSTRACT

Disclosed are a semiconductor device and a method of fabricating the same. The device may include a substrate, an active pattern in an upper portion of the substrate and is extending in a first direction, a gate electrode crossing the active pattern and extending in a second direction intersecting the first direction, a first gate spacer covering a side surface of the gate electrode, a first inhibition layer between the gate electrode and the first gate spacer, and a gate insulating layer between the gate electrode and the active pattern. The gate insulating layer may include a high-k dielectric layer and a gate oxide layer. The gate oxide layer may be between the high-k dielectric layer and the active pattern. The high-k dielectric layer may be between the gate oxide layer and the gate electrode.

20 Claims, 35 Drawing Sheets

(51) Int. Cl.
*H01L 29/49* (2006.01)
*H01L 29/786* (2006.01)

(52) U.S. Cl.
CPC .... *H01L 29/42392* (2013.01); *H01L 29/4908* (2013.01); *H01L 29/78696* (2013.01)

(56) References Cited

U.S. PATENT DOCUMENTS

| | | | |
|---|---|---|---|
| 9,570,609 | B2 | 2/2017 | Obradovic et al. |
| 9,911,592 | B2 | 3/2018 | Doris et al. |
| 9,984,936 | B1 | 5/2018 | Xie et al. |
| 9,991,352 | B1 | 6/2018 | Frougier et al. |
| 10,170,550 | B2 | 1/2019 | Frank et al. |
| 10,319,863 | B2 * | 6/2019 | Lee ................. B82Y 10/00 |
| 2018/0122899 | A1 * | 5/2018 | Guillorn ........... H01L 29/66772 |
| 2019/0288121 | A1 | 9/2019 | Lee et al. |
| 2019/0393097 | A1 | 12/2019 | Tapily et al. |
| 2020/0044053 | A1 | 2/2020 | Cheng et al. |
| 2020/0185539 | A1 | 6/2020 | Lee et al. |
| 2020/0335346 | A1 * | 10/2020 | Ouyang ............. H01L 29/6681 |
| 2021/0366785 | A1 * | 11/2021 | Cheng .............. H01L 29/0847 |
| 2022/0059669 | A1 | 2/2022 | Tomida |

OTHER PUBLICATIONS

Ali Haider et al., 'Area-Selective Atomic Layer Deposition Using an Inductively Coupled Plasma Polymerized Fluorocarbon Layer: A Case Study for Metal Oxides' *The Journal of Physical Chemistry C*, vol. 120, 2016, pp. 26393-26401.

* cited by examiner

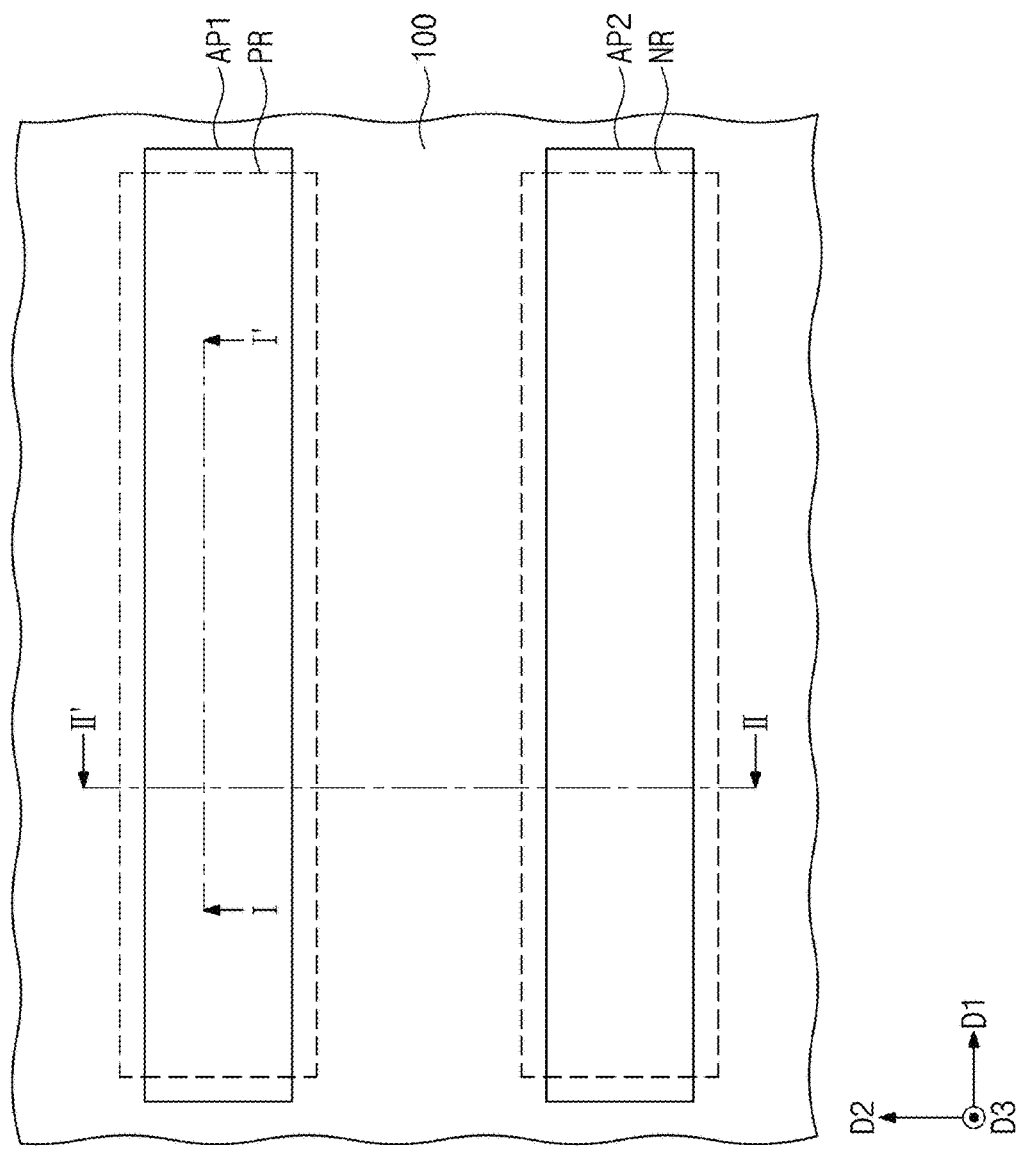

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2020-0128176, filed on Oct. 5, 2020, in the Korean Intellectual Property Office, the entire contents of which are hereby incorporated by reference.

BACKGROUND

The present disclosure relates to a semiconductor device and/or a method of fabricating the same, and in particular, a semiconductor device including a field effect transistor and/or a method of fabricating the same.

Due to their small-sized, multifunctional, and/or low-cost characteristics, semiconductor devices are considered important elements in the electronic industry. The semiconductor devices may be classified as a semiconductor memory device for storing data, a semiconductor logic device for processing data, and a hybrid semiconductor device including both memory and logic elements. As the electronic industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are being increased.

SUMMARY

An embodiment of inventive concepts provides a semiconductor device with improved electrical and reliability characteristics.

An embodiment of inventive concepts provides a semiconductor device having a low power consumption property.

According to an embodiment of inventive concepts, a semiconductor device may include a substrate, an active pattern in an upper portion of the substrate and extending in a first direction, a gate electrode crossing the active pattern and extending in a second direction intersecting the first direction, a first gate spacer covering a side surface of the gate electrode, a first inhibition layer between the gate electrode and the first gate spacer, and a gate insulating layer between the gate electrode and the active pattern. The gate insulating layer may include a high-k dielectric layer and a gate oxide layer. The gate oxide layer may be between the high-k dielectric layer and the active pattern. The high-k dielectric layer may be locally provided between the gate oxide layer and the gate electrode.

According to an embodiment of inventive concepts, a semiconductor device may include a substrate, an active pattern in an upper portion of the substrate and extending in a first direction, a gate electrode crossing the active pattern and extending in a second direction intersecting the first direction, a first gate spacer covering a side surface of the gate electrode, a first inhibition layer between the gate electrode and the first gate spacer, and a gate insulating layer between the gate electrode and the active pattern. The gate insulating layer may include a high-k dielectric layer and a gate oxide layer. The gate oxide layer may be between the high-k dielectric layer and the active pattern. The high-k dielectric layer may extend along a top surface of the gate oxide layer and a side surface of the first inhibition layer. A thickness of the high-k dielectric layer may be larger on the top surface of the gate oxide layer than on the side surface of the first inhibition layer.

According to an embodiment of inventive concepts, a semiconductor device may include a substrate; an active pattern in an upper portion of the substrate and extending in a first direction, the active pattern including a plurality of channel layers on top of each other; a gate electrode crossing the active pattern and surrounding the plurality of channel layers, the gate electrode extending in a second direction intersecting the first direction; a gate spacer covering a side surface of the gate electrode; an inhibition layer between the gate electrode and the gate spacer; a pair of source/drain patterns at both sides of the gate electrode; a gate insulating layer between the gate electrode and each of the plurality of channel layers; an interlayer insulating layer covering the gate electrode and the gate spacer; active contacts penetrating the interlayer insulating layer and being connected respectively to the pair of source/drain patterns; and a gate contact penetrating at least a portion of the interlayer insulating layer and connecting to the gate electrode. The gate insulating layer may include a high-k dielectric layer and a gate oxide layer. The gate oxide layer may be between the high-k dielectric layer and each of the plurality of channel layers. The high-k dielectric layer may be locally provided between the gate oxide layer and the gate electrode.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 6A, 7A, 10A, 13A, and 15A are plan views illustrating a method of fabricating a semiconductor device according to an embodiment of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Example embodiments of inventive concepts will now be described more fully with reference to the accompanying drawings, in which example embodiments are shown.

Figure 1:
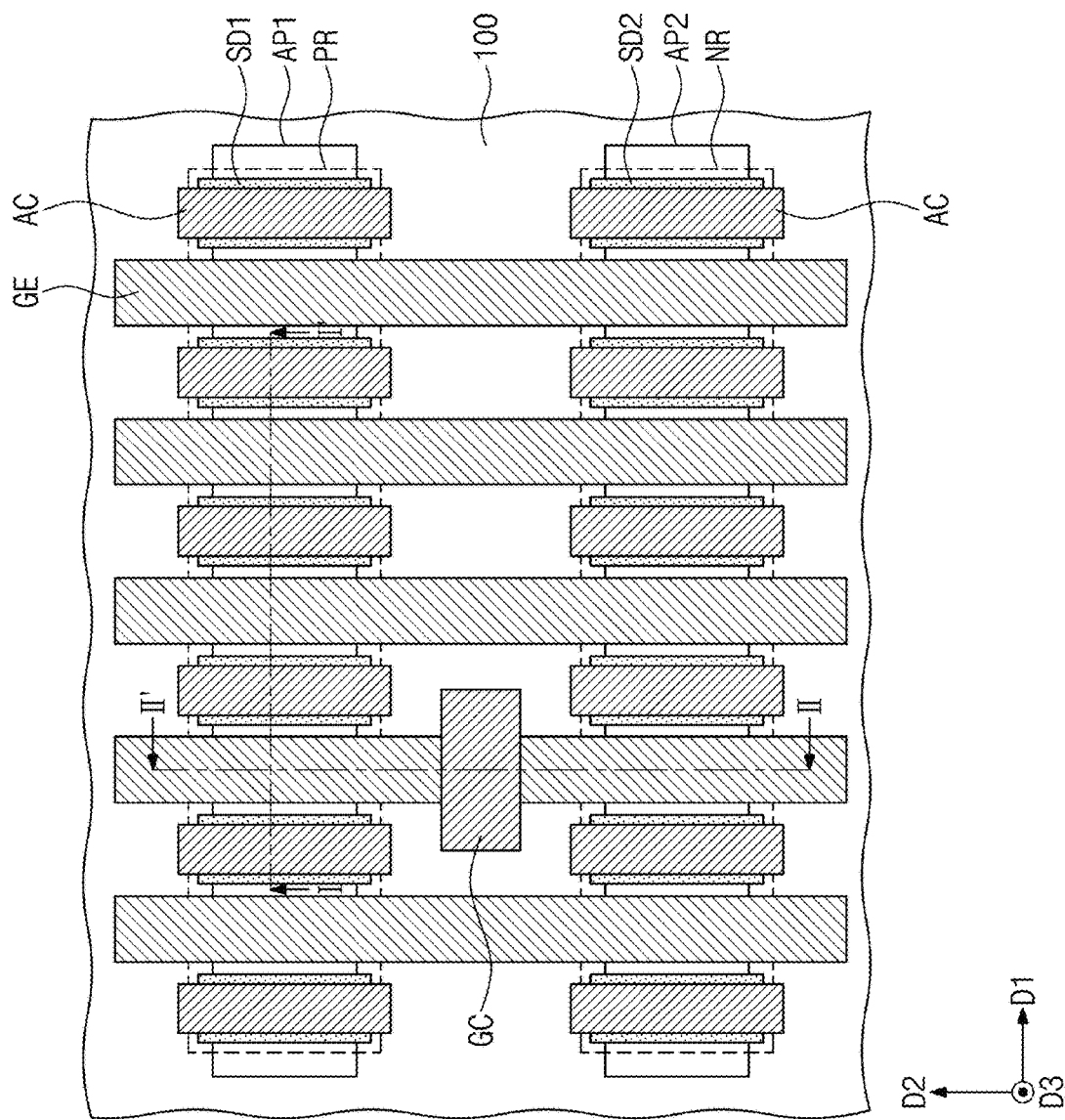
FIG. 1 is a plan view illustrating a semiconductor device according to an embodiment of inventive concepts.
Figure 2A:
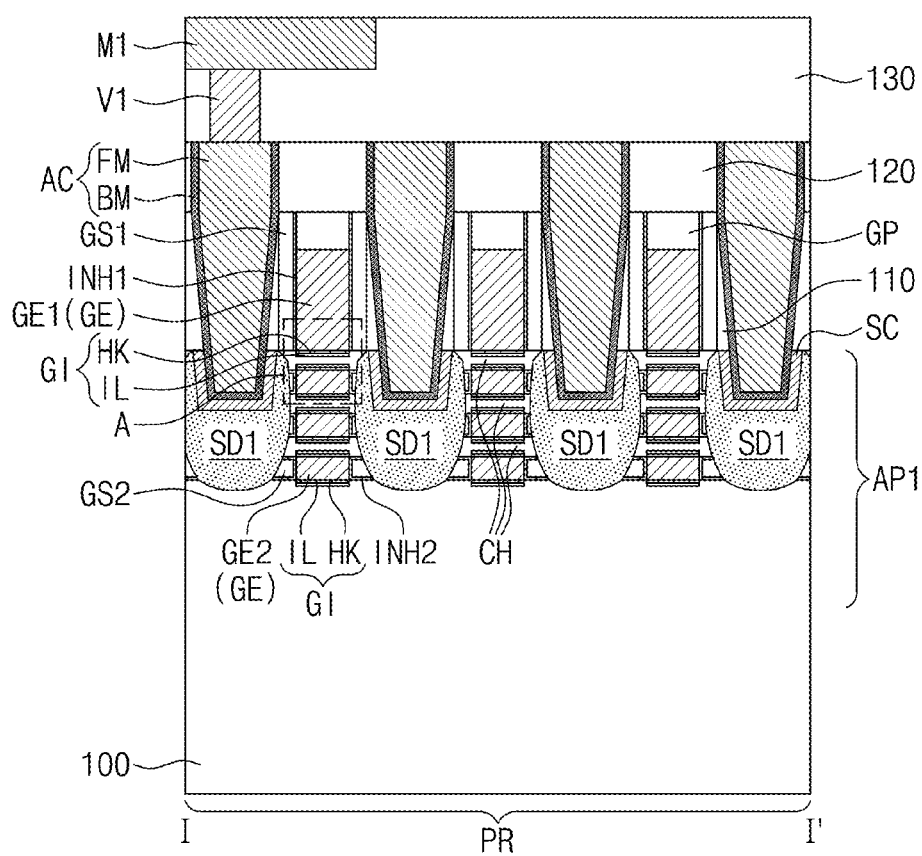
FIGS. 2A and 2B are sectional views, which are respectively taken along lines I-I' and II-II' of FIG. 1 to illustrate a semiconductor device according to an embodiment of inventive concepts.
Figure 2A:
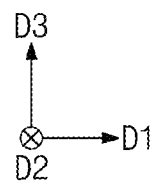
Figure 2B:
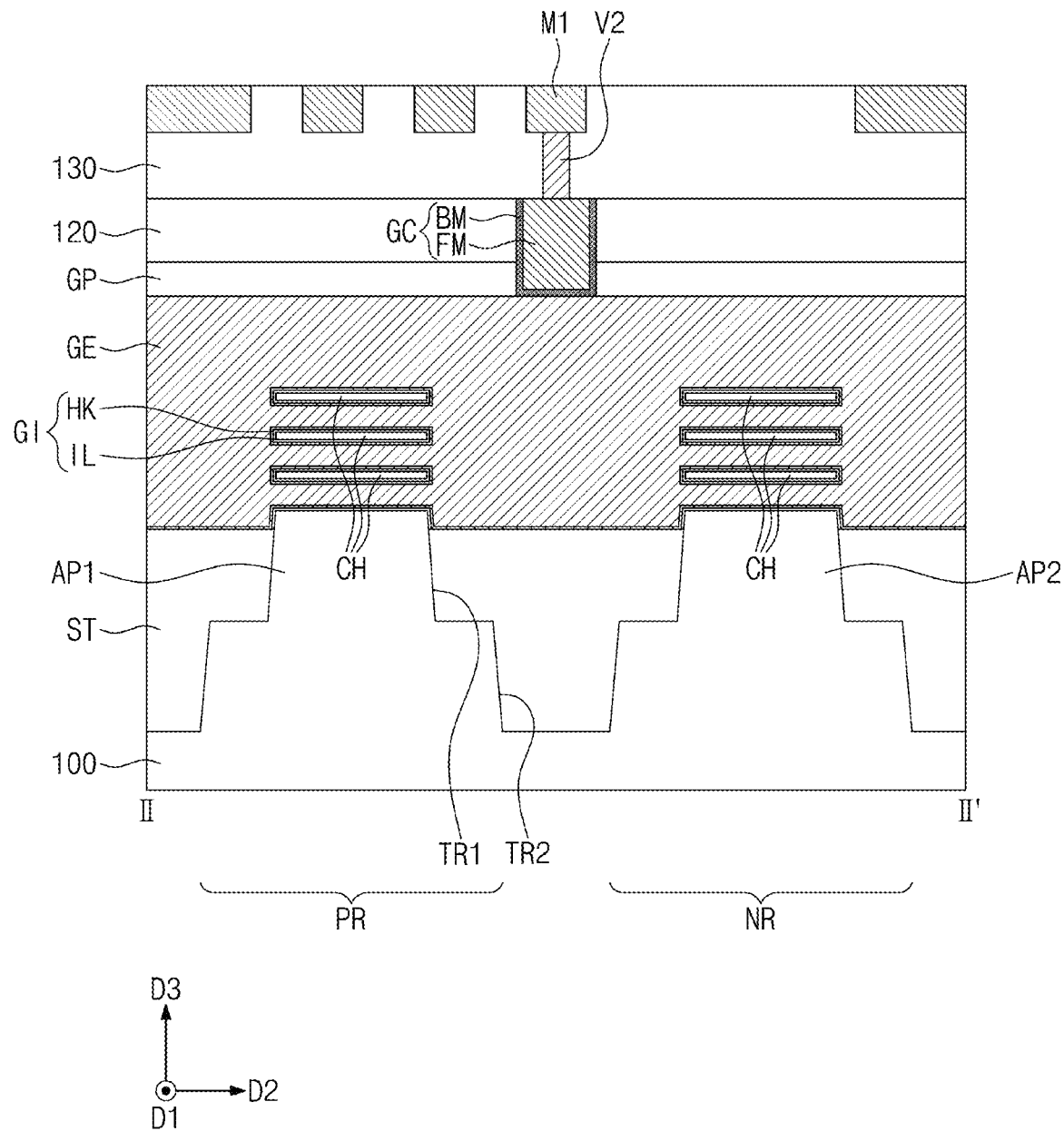
Figure 3A:
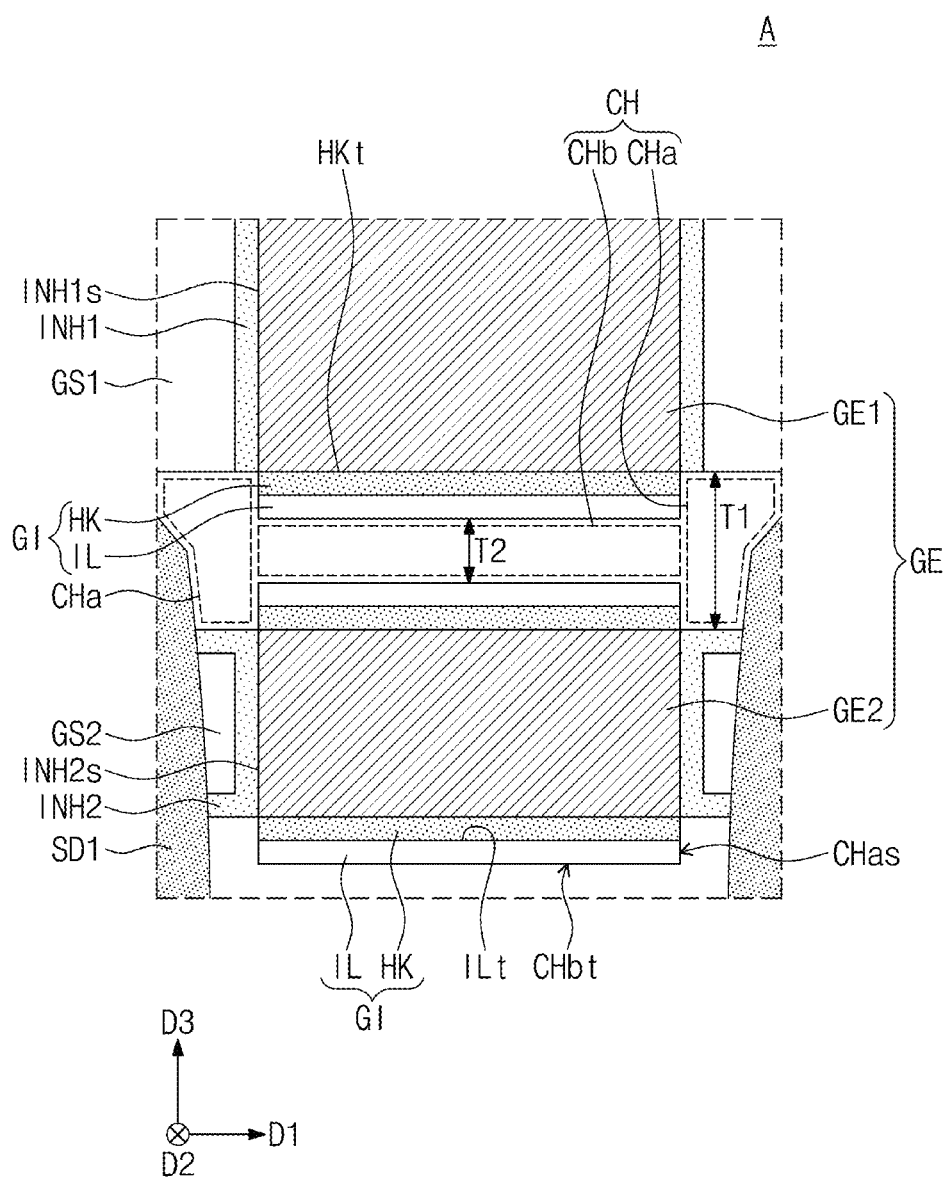
FIGS. 3A to 3F are enlarged sectional views, each of which illustrates a portion (e.g., A of FIG. 2A) of a semiconductor device according to an embodiment of inventive concepts.
Figure 3B:
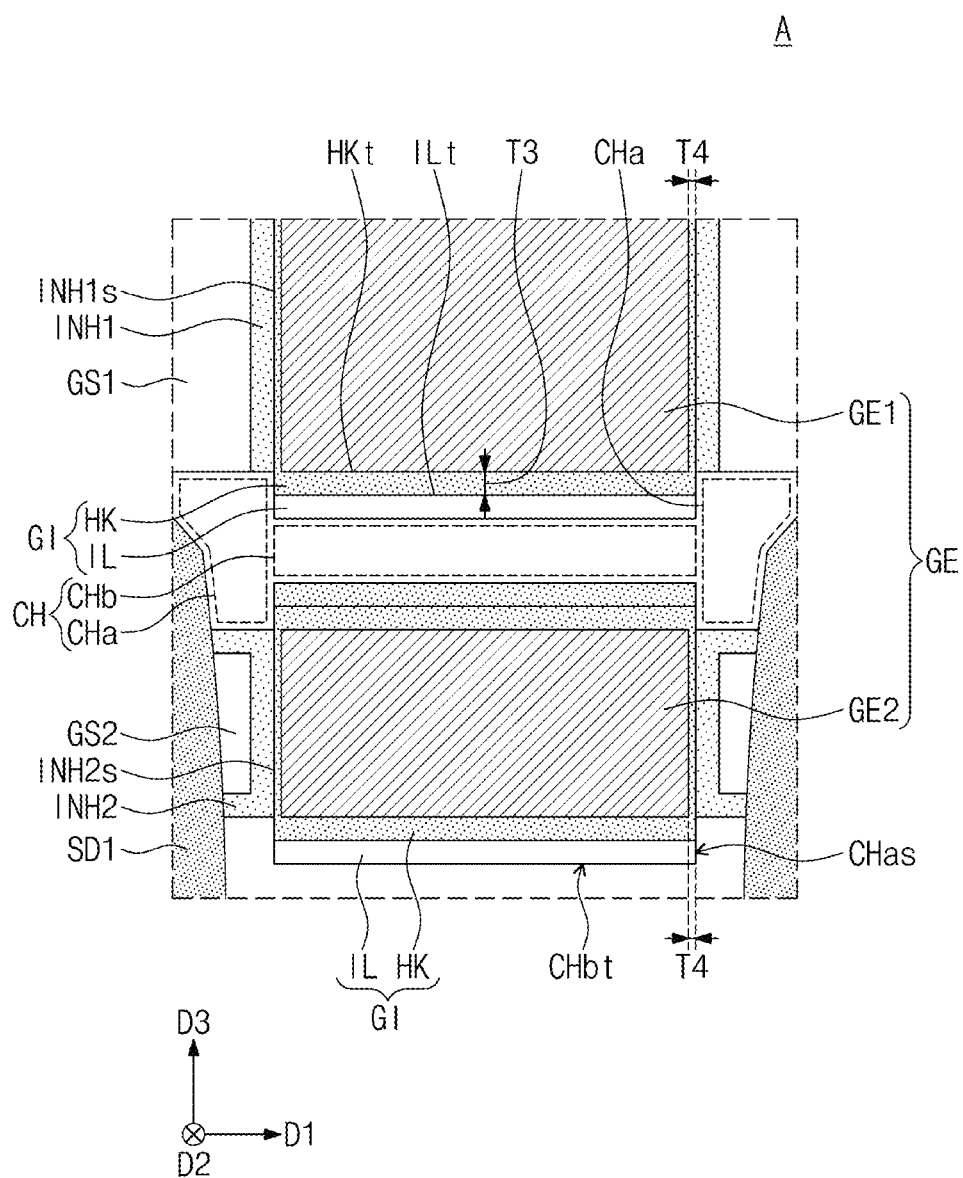
Figure 3C:
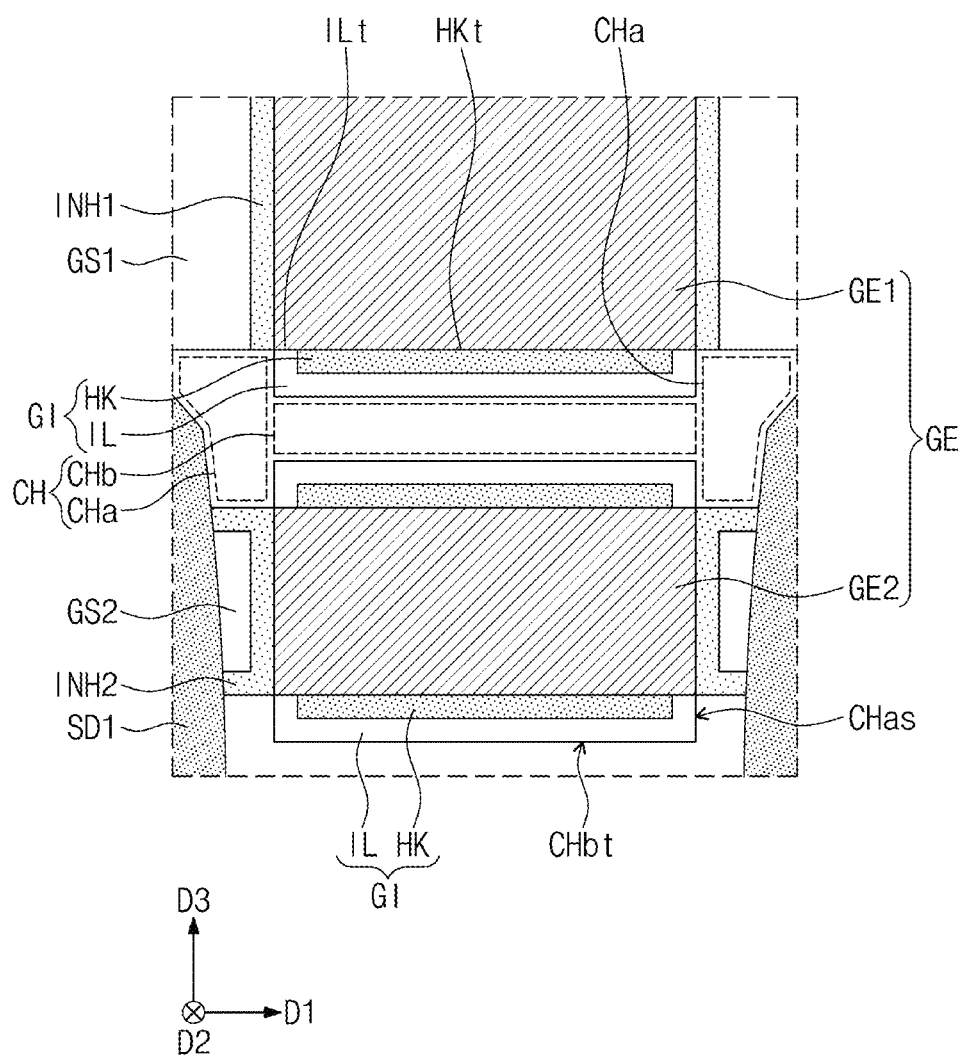
Figure 3D:
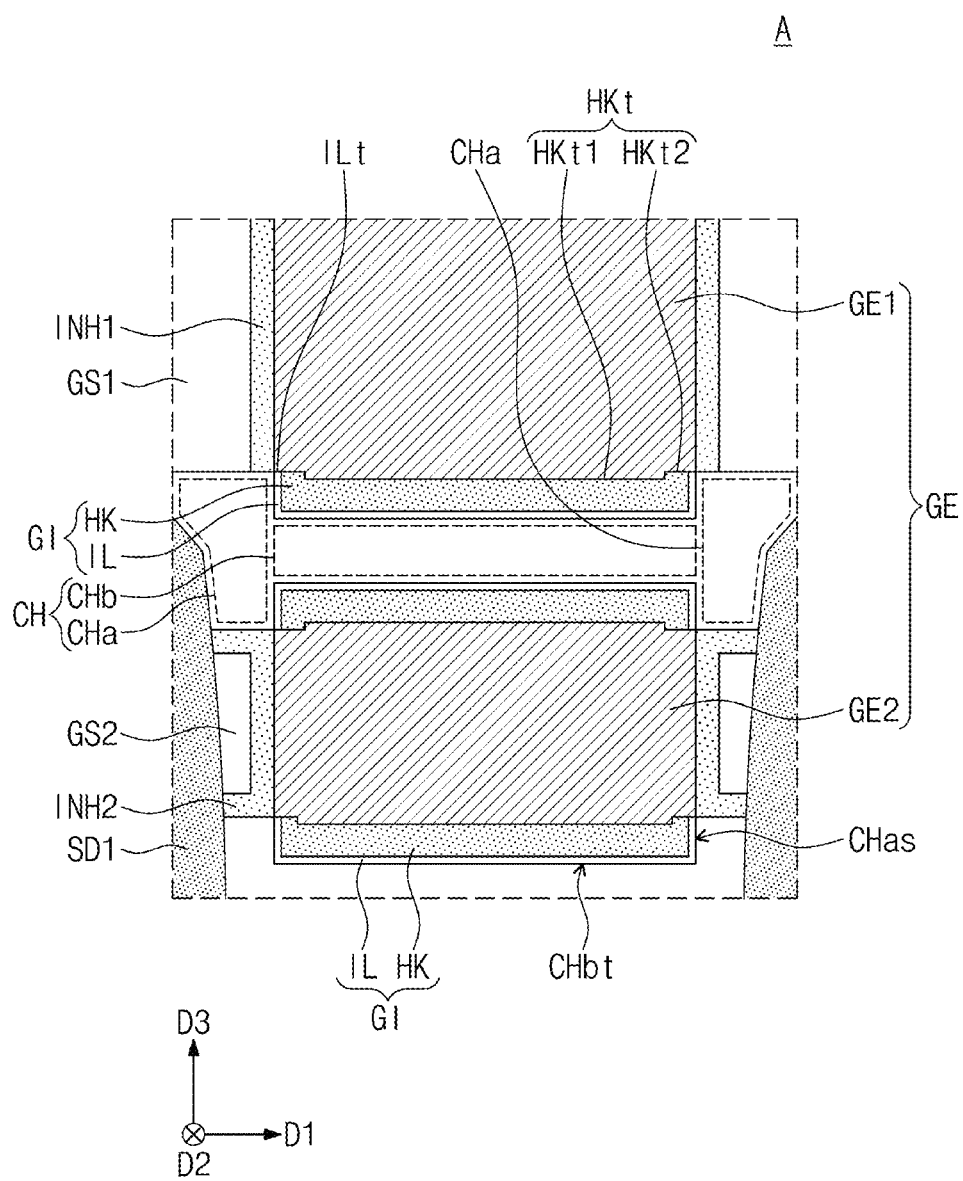
Figure 3E:
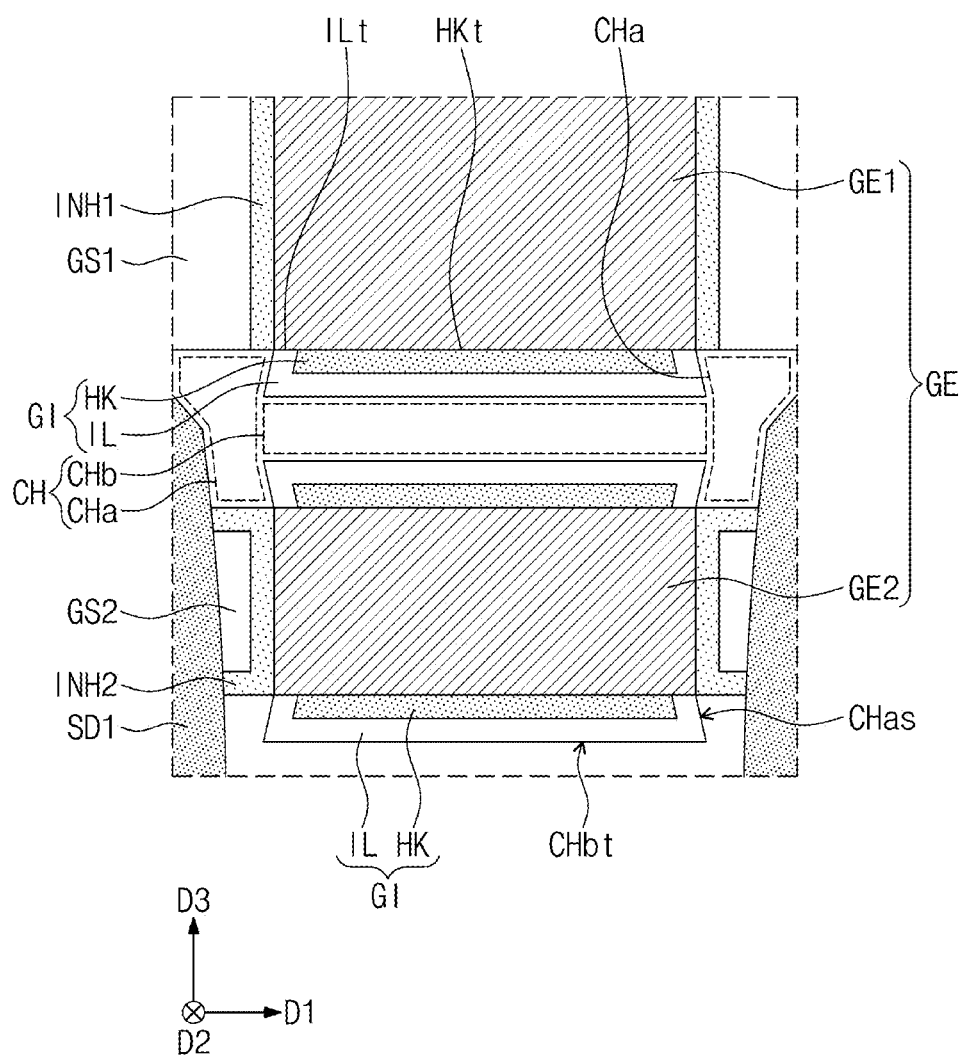
Figure 3F:
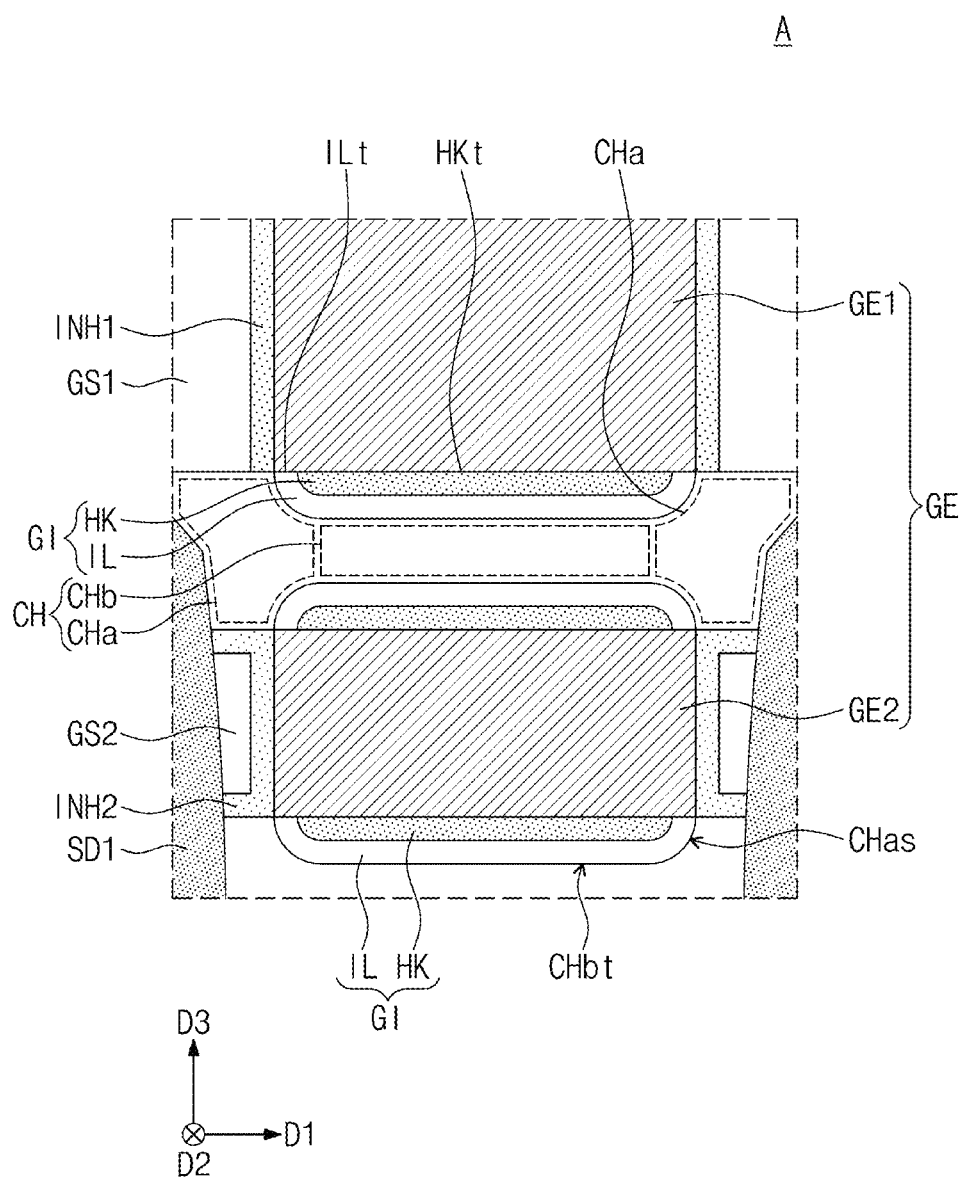

FIG. 1 is a plan view illustrating a semiconductor device according to an embodiment of inventive concepts. FIGS. 2A and 2B are sectional views, which are respectively taken along lines I-I' and II-II' of FIG. 1 to illustrate a semiconductor device according to an embodiment of inventive concepts.

Referring to FIGS. 1, 2A, and 2B, a substrate 100 including a first cell region PR and a second cell region NR may be provided. The substrate 100 may include a semiconductor substrate, which is formed of or includes one of silicon (Si), germanium (Ge), or silicon-germanium (SiGe), or a compound semiconductor substrate. In an embodiment, the substrate 100 may be a silicon substrate. A top surface of the substrate 100 may be parallel to a first direction D1 and a second direction D2 and may be perpendicular to a third direction D3. The first direction D1, the second direction D2, and the third direction D3 may be orthogonal to each other.

A second trench TR2 may be formed in an upper portion of the substrate 100 to define the first and second cell regions PR and NR. The second trench TR2 may be placed between the first and second cell regions PR and NR. The first and second cell regions PR and NR may be spaced apart from each other in the second direction D2 with the second trench TR2 interposed therebetween.

The first and second cell regions PR and NR may be regions, in which a standard cell constituting a logic circuit is provided. As an example, the first cell region PR may be a region, in which PMOS field effect transistors are provided, and the second cell region NR may be a region, in which NMOS field effect transistors are provided.

A first active pattern AP1 and a second active pattern AP2 may be defined by a first trench TR1, which is formed in an upper portion of the substrate 100. The first active pattern AP1 and the second active pattern AP2 may be provided on the first and second cell regions PR and NR, respectively. The first trench TR1 may be shallower than the second trench TR2. The first and second active patterns AP1 and AP2 may be extended in the first direction D1 and may be spaced apart from each other in the second direction D2. The first and second active patterns AP1 and AP2 may be portions of the substrate 100 protruding in the third direction D3. Widths of the first and second active patterns AP1 and AP2 in the first and second directions D1 and D2 may decrease as they are measured in the third direction D3.

A device isolation layer ST may fill the first and second trenches TR1 and TR2. The device isolation layer ST may be formed of or include silicon oxide. An upper portion of each of the first and second active patterns AP1 and AP2 may protrude above the device isolation layer ST (e.g., see FIG. 2B). The device isolation layer ST may not cover the upper portion of each of the first and second active patterns AP1 and AP2. The device isolation layer ST may cover a portion of a side surface of each of the first and second active patterns AP1 and AP2.

Each of the first and second active patterns AP1 and AP2 may include a plurality of channel layers CH, which are stacked. The channel layers CH may be provided in the upper portion of each of the first and second active patterns AP1 and AP2. The channel layers CH may be spaced apart from each other in the third direction D3. The channel layers CH may be formed of or include at least one of, for example, silicon (Si), germanium (Ge), or silicon-germanium (SiGe). As an example, the channel layers CH may be formed of or include silicon (Si).

A pair of first source/drain patterns SD1 may be provided on the upper portion of the first active pattern AP1. As an example, the first source/drain patterns SD1 may be impurity regions of a first conductivity type (e.g., p-type). The channel layers CH may be provided between the pair of the first source/drain patterns SD1.

A pair of second source/drain patterns SD2 may be provided in the upper portion of the second active pattern AP2. As an example, the second source/drain patterns SD2 may be impurity regions of a second conductivity type (e.g., n-type). The channel layers CH may be provided between the pair of the second source/drain patterns SD2.

The first and second source/drain patterns SD1 and SD2 may be epitaxial patterns, which are formed by a selective epitaxial growth process. For example, a top surface of each of the first and second source/drain patterns SD1 and SD2 may be located at substantially the same level as the topmost surface of the topmost one of the channel layers CH. However, inventive concepts are not limited to this example, and in an embodiment, the top surface of each of the first and second source/drain patterns SD1 and SD2 may be located at a level higher than the topmost surface of the topmost one of the channel layers CH.

The first source/drain patterns SD1 may be formed of or include a semiconductor material (e.g., SiGe) whose lattice constant is larger than that of the semiconductor material of the substrate 100. The first source/drain patterns SD1 may exert a compressive stress on the channel layers CH. The second source/drain patterns SD2 may be formed of or include the same semiconductor material (e.g., Si) as the substrate 100.

A gate electrode GE may be provided to cross the first and second active patterns AP1 and AP2 and to extend in the second direction D2. A portion of the gate electrode GE may be overlapped with the channel layers CH in the third direction D3.

Referring to FIG. 2A, the gate electrode GE may include a first portion GE1, which is provided on a top surface of each of the first and second active patterns AP1 and AP2, and a second portion GE2, which is provided in each of regions between the first and second source/drain patterns SD1 and SD2. The first portion GE1 of the gate electrode GE may be located at a level higher than the top surface of each of the first and second active patterns AP1 and AP2 and the top surface of each of the first and second source/drain patterns SD1 and SD2. The second portion GE2 of the gate electrode GE may be extended in the second direction D2 between the channel layers CH to be parallel to a bottom surface of the first portion GE1 of the gate electrode GE.

Referring to FIG. 2B, the gate electrode GE may be provided on top, bottom, and side surfaces of each of the channel layers CH. For example, each of the transistors on the first and second cell regions PR and NR may be a three-dimensional field effect transistor, in which the gate electrode GE is provided to three-dimensionally surround the channel layers CH.

A first gate spacer GS1 and a second gate spacer GS2 may be provided to cover a side surface of the gate electrode GE. Referring to FIG. 2A, the first gate spacer GS1 may cover a side surface of the first portion GE1 of the gate electrode GE, and the second gate spacer GS2 may cover a side surface of the second portion GE2 of the gate electrode GE.

The first and second gate spacers GS1 and GS2 may be extended in the second direction D2 or along the gate electrode GE. A top surface of the first gate spacer GS1 may be located at a level higher than the top surface of the first portion GE1 of the gate electrode GE. The first and second gate spacers GS1 and GS2 may be formed of or include at least one of, for example, SiCN, SiCON, or SiN. In an embodiment, the first and second gate spacers GS1 and GS2 may be a multi-layered structure, which includes at least two different materials selected from SiCN, SiCON, and SiN.

A first inhibition layer INH1 may be provided between the first gate spacer GS1 and the first portion GE1 of the gate electrode GE. The first inhibition layer INH1 may be in direct contact with the first portion GE1 of the gate electrode GE. The first gate spacer GS1 and the first portion GE1 of the gate electrode GE may be spaced apart from each other with the first inhibition layer INH1 interposed therebetween. The first inhibition layer INH1 may cover a side surface of the first gate spacer GS1 adjacent to the first portion GE1 of the gate electrode GE.

A second inhibition layer INH2 may be provided between the second gate spacer GS2 and the second portion GE2 of the gate electrode GE. The second inhibition layer INH2 may be in direct contact with the second portion GE2 of the gate electrode GE. The second gate spacer GS2 and the second portion GE2 of the gate electrode GE may be spaced apart from each other with the second inhibition layer INH2 interposed therebetween. The second inhibition layer INH2 may cover a side surface of the second gate spacer GS2, which is adjacent to the second portion GE2 of the gate electrode GE, and may cover top and bottom surfaces of the second gate spacer GS2, which are adjacent to the channel layers CH.

The first and second inhibition layers INH1 and INH2 may prevent or suppress a high-k dielectric layer HK, which will be described below, from being deposited on the side surface of the gate electrode GE. The high-k dielectric layer HK may not be deposited on a surface provided with the first or second inhibition layer INH1 or INH2 and, even when it is deposited thereon, it may be deposited to have a thinner thickness that on a surface which is not provided with the first or second inhibition layer INH1 or INH2. The first and second inhibition layers INH1 and INH2 may be formed of or include the same material. As an example, in the case where the high-k dielectric layer HK includes hafnium oxide ($HfO_2$), the first and second inhibition layers INH1 and INH2 may include acetylacetone ($CH_3COCH_2COCH_3$), but inventive concepts are not limited to this example. For example, the material properties of the first and second inhibition layers INH1 and INH2 may be changed depend on material properties of the high-k dielectric layer HK.

A gate capping pattern GP may be provided on the gate electrode GE. For example, the first inhibition layer INH1 may be provided between the gate capping pattern GP and the first gate spacer GS1, and the gate capping pattern GP may be in contact with the first inhibition layer INH1. The gate capping pattern GP may be extended along the gate electrode GE and in the second direction D2. The gate capping pattern GP may be formed of or include a material having an etch selectivity with respect to first and second interlayer insulating layers 110 and 120, which will be described below. For example, the gate capping patterns GP may be formed of or include at least one of SiON, SiCN, SiCON, or SiN.

A gate insulating layer GI may be provided between the gate electrode GE and the channel layers CH. More specifically, the gate insulating layer GI including a gate oxide layer IL and the high-k dielectric layer HK may be provided between the first portion GE1 of the gate electrode GE and the topmost one of the channel layers CH and between the second portion GE2 of the gate electrode GE and the channel layers CH. The gate insulating layer GI may be extended along the top and bottom surfaces of the first and second portions GE1 and GE2 of the gate electrode GE. The gate insulating layer GI may cover a top surface of the device isolation layer ST, which is provided below the gate electrode GE.

When viewed in the sectional view of FIG. 2A, the gate oxide layer IL and the high-k dielectric layer HK of the gate insulating layer GI may be overlapped with a portion of each of the channel layers CH in the first direction D1 and may not be overlapped with the first and second inhibition layers INH1 and INH2 and the first and second gate spacers GS1 and GS2 in the first direction D1. The gate oxide layer IL and the high-k dielectric layer HK of the gate insulating layer GI may be provided to surround top, bottom, and side surfaces of each of the channel layers CH, when viewed in the sectional view of FIG. 2B. The gate oxide layer IL may be provided between the high-k dielectric layer HK and the channel layers CH.

The gate oxide layer IL may be formed of or include at least one of, for example, silicon oxide or silicon oxynitride. In an embodiment, the gate oxide layer IL may be formed of or include silicon oxide. The high-k dielectric layer HK may be formed of or include at least one of high-k dielectric materials having dielectric constants higher than silicon oxide and silicon nitride. The high-k dielectric layer HK may be formed of or include at least one of, for example, hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate insulating layer GI including the gate oxide layer IL and the high-k dielectric layer HK and other elements adjacent thereto will be described in more detail with reference to FIGS. 3A to 3F.

The gate electrode GE may include a first metal pattern and a second metal pattern on the first metal pattern. The first metal pattern may be provided on the gate insulating layer GI and may be adjacent to each of the channel layers CH. The first metal pattern may include a work function metal, which can be used to adjust a threshold voltage of the transistor. By adjusting a thickness and composition of the first metal pattern, it may be possible to realize a transistor having a desired threshold voltage.

The first metal pattern may be formed of or include a metal nitride. For example, the first metal pattern may include at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of work function metal layers, which are stacked.

The second metal pattern may include a metallic material whose resistance is lower than the first metal pattern. For example, the second metal pattern may include at least one metallic material, which is selected from the group consisting of tungsten (W), aluminum (Al), titanium (Ti), and tantalum (Ta).

The first interlayer insulating layer 110 may be provided on the substrate 100. The first interlayer insulating layer 110 may cover the first gate spacer GS1 and the first and second source/drain patterns SD1 and SD2. The first interlayer insulating layer 110 may have a top surface that is substantially coplanar with the top surface of the gate capping pattern GP and the top surface of the first gate spacer GS1. The second interlayer insulating layer 120 may be provided on the first interlayer insulating layer 110 to cover the top surface of the gate capping pattern GP and the top surface of the first gate spacer GS1. For example, the first and second interlayer insulating layers 110 and 120 may be formed of or include silicon oxide.

Active contacts AC may be provided to penetrate the first and second interlayer insulating layers 110 and 120 and may be electrically connected to the first and second source/drain patterns SD1 and SD2, respectively. A pair of the active contacts AC may be respectively provided at both sides of the gate electrode GE. When viewed in a plan view, each of the active contacts AC may be a bar-shaped pattern extending in the second direction D2.

Each of the active contacts AC may include a conductive pattern FM and a barrier pattern BM enclosing the conductive pattern FM. For example, the conductive pattern FM may be formed of or include at least one metal of aluminum, copper, tungsten, molybdenum, or cobalt. The barrier pattern BM may cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

The active contacts AC may be self-aligned contacts. In other words, the active contacts AC may be formed in a self-aligned manner using the gate capping pattern GP and the first gate spacer GS1. For example, the active contacts AC may cover at least a portion of the side surface of the first gate spacer GS1. Unlike the illustrated structure, the active contact AC may cover a portion of the top surface of the gate capping pattern GP.

A silicide pattern SC may be disposed between each of the active contacts AC and each of the first and second source/drain patterns SD1 and SD2. Each of the active contacts AC may be electrically connected to a corresponding one of the first and second source/drain patterns SD1 and SD2 through the silicide pattern SC. The silicide pattern SC may be formed of or include at least one of metal-silicide materials. For example, the silicide pattern SC may be formed of or include at least one of titanium-silicide, tantalum-silicide, tungsten-silicide, nickel-silicide, or cobalt-silicide.

A gate contact GC, which is electrically connected to the gate electrode GE, may be provided to penetrate the second interlayer insulating layer 120 and the gate capping pattern GP. For example, the gate contact GC may be provided on the device isolation layer ST between the first and second cell regions PR and NR. When viewed in a plan view, the gate contact GC may be a bar-shaped pattern extending in the first direction D1. The gate contact GC may include the conductive pattern FM and the barrier pattern BM enclosing the conductive pattern FM, similar to the active contacts AC.

A third interlayer insulating layer 130 may be provided on the second interlayer insulating layer 120. First interconnection lines M1, first vias V1, and second vias V2 may be provided in the third interlayer insulating layer 130. The first and second vias V1 and V2 may be provided below the first interconnection lines M1. The first interconnection lines M1 may be extended in the first direction D1. The first interconnection lines M1 may be arranged in the first or second direction D1 or D2. The first via V1 may be provided between one of the first interconnection lines M1 and one of the active contacts AC to electrically connect them to each other. The second via V2 may be provided between one of the first interconnection lines M1 and one of the gate contacts GC to electrically connect them to each other.

The first interconnection lines M1 and the first or second via V1 or V2 may be connected to form a single conductive structure. For example, the first interconnection lines M1 and the first or second via V1 or V2 may be formed through the same process. The first interconnection lines M1 and the first or second via V1 or V2 may constitute a single conductive structure, which is formed by a dual damascene process. Although not shown, additional metal layers (e.g., M2, M3, M4, and so forth) may be further stacked on the third interlayer insulating layer 130.

FIGS. 3A to 3F are enlarged sectional views, each of which illustrates a portion (e.g., A of FIG. 2A) of a semiconductor device according to an embodiment of inventive concepts. A detailed structure of the semiconductor device will be described in more detail with reference to FIGS. 3A to 3F.

Referring to FIGS. 1, 2A, 2B, and 3A, each of the channel layers CH may include first portions CHa, which are overlapped with the first and second gate spacers GS1 and GS2 and the first and second inhibition layers INH1 and INH2 in the third direction D3, and a second portion CHb, which is provided between the first portions CHa, is extended in the first direction D1, and is overlapped with the gate electrode GE in the third direction D3. The first portions CHa may be spaced apart from each other in the first direction D1 with the second portion CHb interposed therebetween. The second portion CHb may be provided between the first portions CHa and may have a uniform thickness in the third direction D3.

Each of the first portions CHa may have a first thickness T1 in the third direction D3, and the second portion CHb may have a second thickness T2 in the third direction D3. For example, the first thickness T1 may be defined as the largest thickness of each of the first portions CHa in the third direction D3. The first thickness T1 may be larger than the second thickness T2.

Each of the first portions CHa may have an inner side surface CHas that is adjacent to the second portion CHb. The inner side surface CHas of each of the first portions CHa may be parallel to, for example, the third direction D3. A portion of the inner side surface CHas of each of the first portions CHa may be in contact with the second portion CHb, and another portion may be in contact with the gate insulating layer GI but not with the second portion CHb.

The second portion CHb may have a top surface CHbt that is adjacent to the gate electrode GE. The top surface CHbt of the second portion CHb may be parallel to, for example, the first and second directions D1 and D2 and may be perpendicular to the inner side surface CHas of each of the first portions CHa. The top surface CHbt of the second portion CHb may be covered with the gate oxide layer IL.

The gate insulating layer GI, which includes the gate oxide layer IL and the high-k dielectric layer HK, may be provided in a space, which is surrounded by the opposite inner side surfaces CHas of the first portions CHa and the top surface CHbt of the second portion CHb. In detail, the gate oxide layer IL and the high-k dielectric layer HK may be overlapped with the first portions CHa in the first direction D1 and may be provided between the gate electrode GE and the second portion CHb. The gate oxide layer IL may cover the top surface CHbt of the second portion CHb and portions of the inner side surfaces CHas of the first portions CHa, and the high-k dielectric layer HK may cover a top surface ILt of the gate oxide layer IL and portions of the inner side surfaces CHas of the first portions CHa, which are not covered with the gate oxide layer IL.

A top surface HKt of the high-k dielectric layer HK may be in contact with the top or bottom surface of the gate electrode GE. The high-k dielectric layer HK may not be provided on a side surface INH1s of the first inhibition layer INH1 and a side surface INH2s of the second inhibition layer INH2. In other words, the high-k dielectric layer HK may not be in contact with the first and second inhibition layers INH1 and INH2. The thickness of the high-k dielectric layer HK in the third direction D3 may have a substantially constant value, between the first portions CHa. The top surface HKt of the high-k dielectric layer HK may be parallel to the first and second directions D1 and D2. For example, the top surface HKt of the high-k dielectric layer HK may be substantially coplanar with the top or bottom surface of the gate electrode GE. For example, the top surface HKt of the high-k dielectric layer HK may be located at a level that is lower than or equal to the top surfaces of the first portions CHa and the bottom surface of the first gate spacer GS1.

Since the high-k dielectric layer HK is not provided on the side surfaces INH1s and INH2s of the first and second inhibition layers INH1 and INH2, it may be possible to reduce capacitance between the gate electrode GE and the first source/drain patterns SD1. This may make it possible to realize a low power consumption semiconductor device.

Since the high-k dielectric layer HK is provided to have a constant thickness on the top or bottom surface of the gate electrode GE, it may be possible to reduce an internal leakage current in the semiconductor device and thereby to improve the reliability of the semiconductor device.

Referring to FIGS. 1, 2A, 2B, and 3B, the high-k dielectric layer HK may be provided on the top surface ILt of the gate oxide layer IL, the side surface INH1s of the first inhibition layer INH1, and the side surface INH2s of the second inhibition layer INH2. For concise description, a previously-described element may be identified by the same reference number without repeating an overlapping description thereof.

The high-k dielectric layer HK may be extended in the first direction D1 to cover the top surface ILt of the gate oxide layer IL and may be extended in the third direction D3 to cover each of the side surfaces INH1s and INH2s of the first and second inhibition layers INH1 and INH2. The high-k dielectric layer HK may be provided to surround the gate electrode GE. Unlike that illustrated in the drawings, the high-k dielectric layer HK may be provided to cover a portion of each of the side surfaces INH1s and INH2s of the first and second inhibition layers INH1 and INH2.

A portion of the high-k dielectric layer HK, which is provided on the top surface ILt of the gate oxide layer IL, may have a third thickness T3 in the third direction D3. Another portion of the high-k dielectric layer HK, which is provided on the side surfaces INH1s and INH2s of the first and second inhibition layers INH1 and INH2, may have a fourth thickness T4 in the first direction D1. The third thickness T3 may be larger than the fourth thickness T4. The structure, in which the third thickness T3 is larger than the fourth thickness T4, may result from a difference in material properties between the high-k dielectric layer HK and the first and second inhibition layers INH1 and INH2.

Since the high-k dielectric layer HK is thinner on the side surfaces INH1s and INH2s of the first and second inhibition layers INH1 and INH2 than on the top surface ILt of the gate oxide layer IL, it may be possible to reduce a parasitic capacitance between the gate electrode GE and the first source/drain patterns SD1. This may make it possible to realize a low power consumption semiconductor device.

Referring to FIGS. 1, 2A, 2B, and 3C, the gate oxide layer IL may be provided to cover the first and second portions CHa and CHb of each of the channel layers CH. For concise description, a previously-described element may be identified by the same reference number without repeating an overlapping description thereof.

The gate oxide layer IL may conformally cover the inner side surfaces CHas of the first portions CHa and the top surface CHbt of the second portion CHb. The thickness of the gate oxide layer IL may be substantially constant on the inner side surfaces CHas of the first portions CHa and the top surface CHbt of the second portion CHb. The topmost surface ILt of the gate oxide layer IL may be substantially coplanar with the top surfaces of the first portions CHa, the top surface HKt of the high-k dielectric layer HK, and the top or bottom surface of the gate electrode GE.

The high-k dielectric layer HK may be enclosed by the gate oxide layer IL and the gate electrode GE. The high-k dielectric layer HK may be spaced apart from the channel layers CH with the gate oxide layer IL interposed therebetween.

Referring to FIGS. 1, 2A, 2B, and 3D, the gate oxide layer IL may be provided to cover the first and second portions CHa and CHb of each of the channel layers CH, and the high-k dielectric layer HK may be provided on the gate oxide layer IL to be extended along the top surface of the gate oxide layer IL. For concise description, a previously-described element may be identified by the same reference number without repeating an overlapping description thereof.

The gate oxide layer IL may cover the inner side surfaces CHas of the first portions CHa and the top surface CHbt of the second portion CHb. The thickness of the gate oxide layer IL may be substantially constant on the inner side surfaces CHas of the first portions CHa and the top surface CHbt of the second portion CHb. The thickness of the gate oxide layer IL may be smaller than that in the embodiments of FIGS. 3A to 3C. The high-k dielectric layer HK may be surrounded by the gate oxide layer IL and the gate electrode GE. The high-k dielectric layer HK may be spaced apart from the channel layers CH with the gate oxide layer IL interposed therebetween.

The thickness of the high-k dielectric layer HK may not be constant in the third direction D3. In detail, the top surface HKt of the high-k dielectric layer HK may have a first surface HKt1 and a second surface HKt2. The first surface HKt1 of the top surface HKt of the high-k dielectric layer HK may be located at a level lower than the second surface HKt2 of the top surface HKt of the high-k dielectric layer HK. The first surface HKt1 may be located at a level lower than the topmost surface ILt of the gate oxide layer IL, and the second surface HKt2 may be substantially coplanar with the topmost surface ILt of the gate oxide layer IL. The first surface HKt1 may be closer to the second portion CHb of each of the channel layers CH than the second surface HKt2.

The gate electrode GE may protrude toward the second portion CHb of each of the channel layers CH, in a direction parallel or antiparallel to the third direction D3. At least a portion of the gate electrode GE may be surrounded by the high-k dielectric layer HK. The portion of the gate electrode GE, which is surrounded by the high-k dielectric layer HK, may be overlapped with the first portions CHa of each of the channel layers CH in the first direction D1.

Referring to FIGS. 1, 2A, 2B, and 3E, the inner side surface CHas of each of the first portions CHa of the channel layers CH may have a specific inclination angle relative to the third direction D3. For concise description, a previously-described element may be identified by the same reference number without repeating an overlapping description thereof.

The inner side surface CHas of each of the first portions CHa may not be perpendicular to the top surface CHbt of the second portion CHb. As an example, the inner side surface CHas of each of the first portions CHa may be at an acute angle to the top surface CHbt of the second portion CHb. For example, at least a portion of the gate oxide layer IL may be overlapped with the first and second inhibition layers INH1 and INH2 and the first and second gate spacers GS1 and GS2 in the third direction D3.

However, inventive concepts are not limited to this example, and in an embodiment, the inner side surface CHas of each of the first portions CHa may be at an obtuse angle to the top surface CHbt of the second portion CHb.

Referring to FIGS. 1, 2A, 2B, and 3F, the inner side surfaces CHas of the first portions CHa of each of the channel layers CH may have a curved profile. For concise description, a previously-described element may be identified by the same reference number without repeating an overlapping description thereof.

The inner side surface CHas of each of the first portions CHa may not be perpendicular to the top surface CHbt of the second portion CHb. For example, the inner side surface CHas of each of the first portions CHa may be connected to the top surface CHbt of the second portion CHb, while having a continuously changing inclination angle. Accordingly, a portion of the bottom surface of the gate oxide layer IL, which is in contact with each of the channel layers CH, and a portion of the bottom surface of the high-k dielectric layer HK, which is in contact with the gate oxide layer IL, may also have a curved profile.

Figure 4:
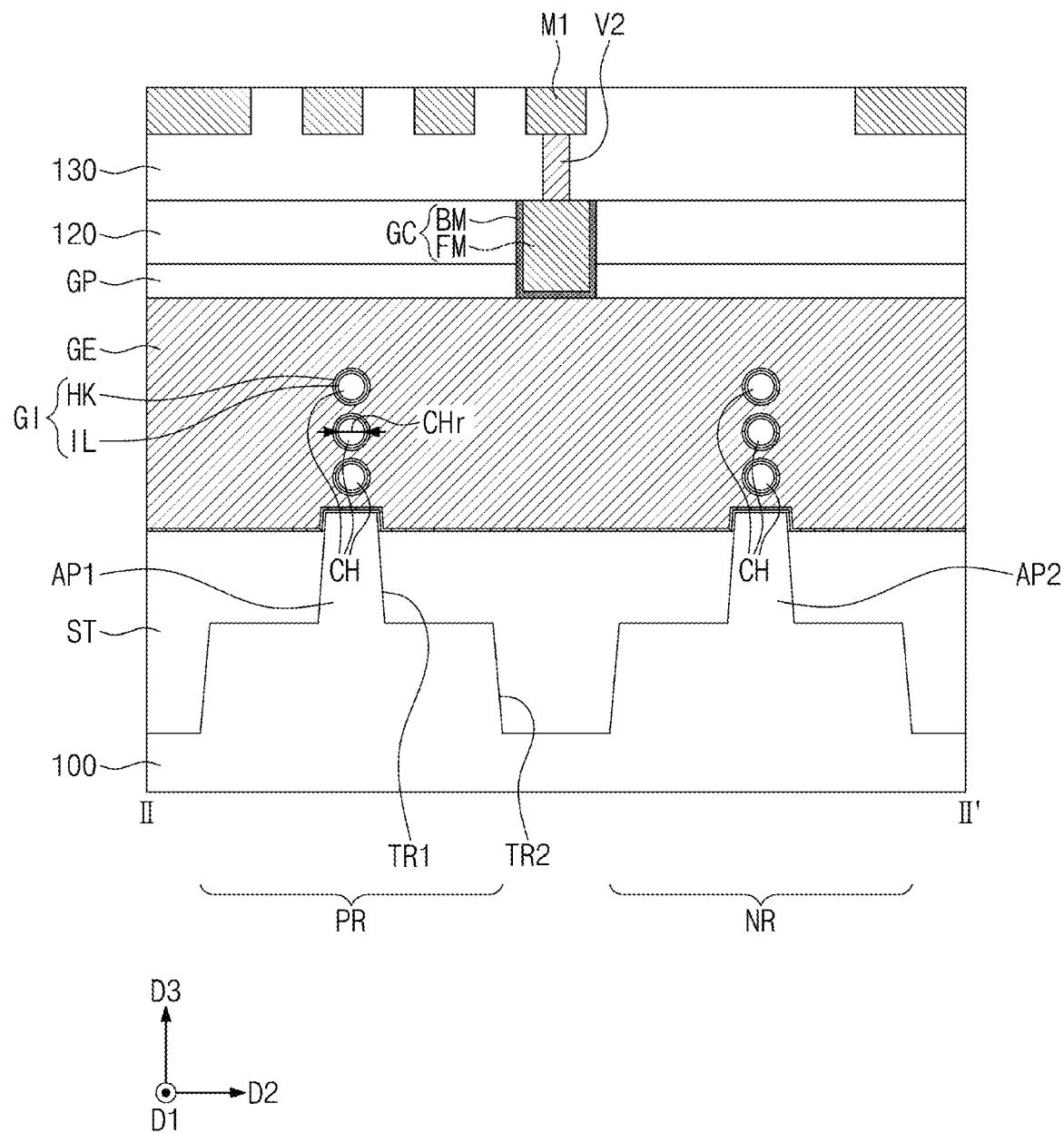
FIG. 4 is a sectional view, which is taken along a line II-II' of FIG. 1 to illustrate a semiconductor device according to an embodiment of inventive concepts.

FIG. 4 is a sectional view, which is taken along a line II-II' of FIG. 1 to illustrate a semiconductor device according to an embodiment of inventive concepts. In the following description of FIG. 4, a previously-described element may be identified by the same reference number without repeating an overlapping description thereof, for concise description.

Referring to FIGS. 1, 2A, and 4, the channel layers CH may be extended in the first direction D1, in the upper portion of each of the first and second active patterns AP1 and AP2. The channel layers CH may be spaced apart from each other in the third direction D3. Unlike the channel layers CH previously described with reference to FIGS. 1, 2A, and 2B, each of the channel layers CH may have a circular section, when viewed in a sectional view of FIG. 4. For example, the channel layers CH may be circular-pillar-shaped patterns, which are extended in the first direction D1. A sectional diameter CHr of each of the channel layers CH may be substantially equal to an upper width of each of the first and second active patterns AP1 and AP2. However, inventive concepts are not limited to this example, and in an embodiment, the section of each of the channel layers CH may have various shapes (e.g., an elliptical shape, a truncated circular shape, and polygonal (e.g., rectangular) shapes).

The sectional diameter CHr of each of the channel layers CH may be reduced by a trimming process, a part of a fabrication process to be described with reference to FIGS. 16A and 16B. However, inventive concepts are not limited to this example, and in an embodiment, the section of each of the channel layers CH may have a circular shape whose upper and/or lower portions are partially cut by the trimming process to be described below.

The gate electrode GE may be disposed to surround each of the channel layers CH. The gate insulating layer GI including the gate oxide layer IL and the high-k dielectric layer HK may be provided between the gate electrode GE and each of the channel layers CH. The gate insulating layer GI may be provided to surround each of the channel layers CH. For example, each of the transistors on the first and second cell regions PR and NR may be a three-dimensional field effect transistor, in which the gate electrode GE is provided to three-dimensionally surround the channel layers CH.

Figure 5A:
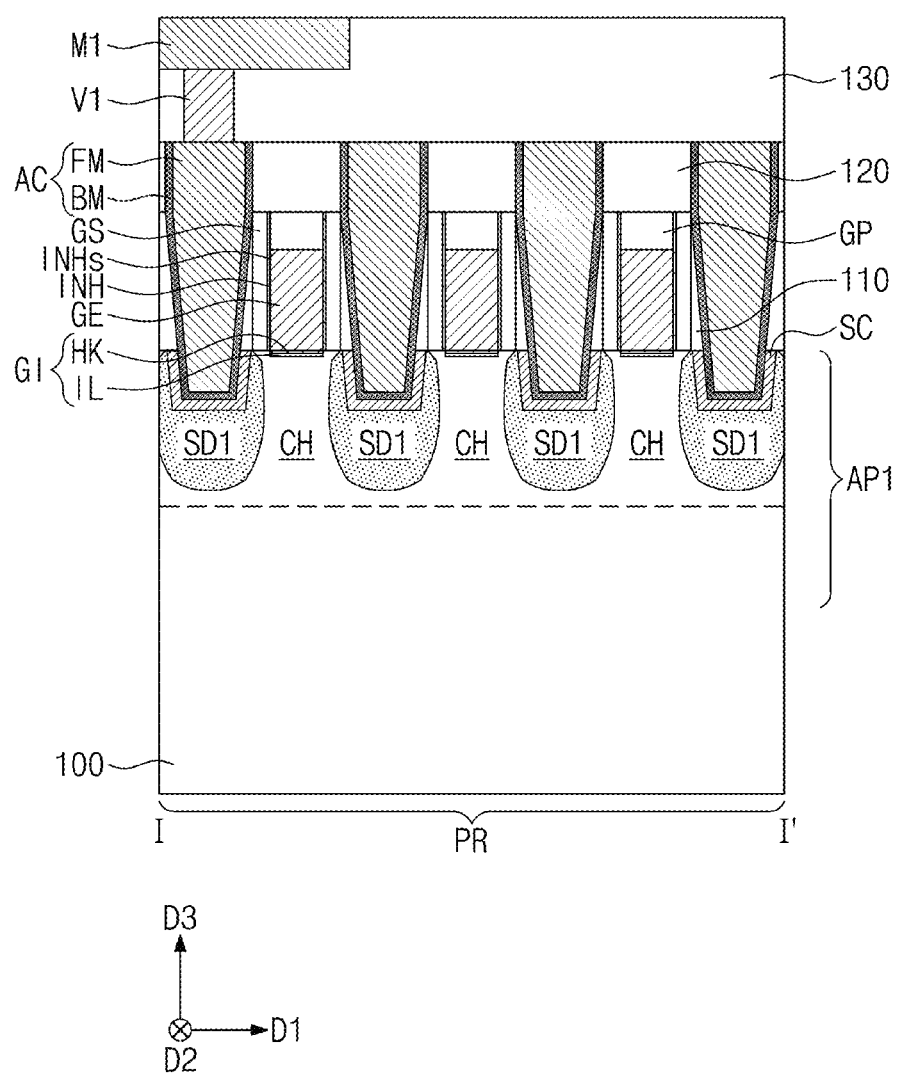
FIGS. 5A and 5B are sectional views, which are respectively taken along the lines I-I' and II-II' of FIG. 1 to illustrate a semiconductor device according to an embodiment of inventive concepts.
Figure 5B:
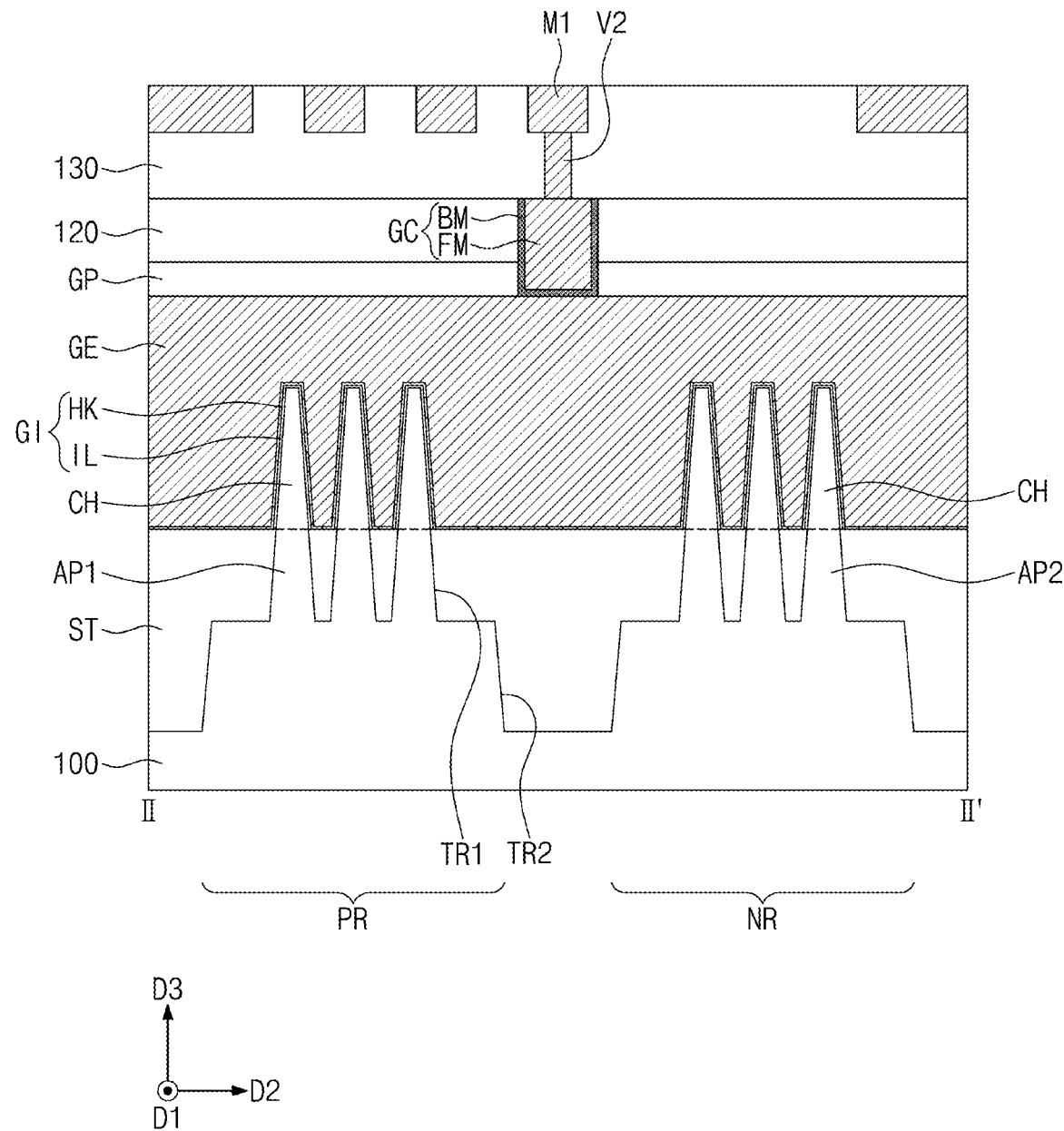

FIGS. 5A and 5B are sectional views, which are respectively taken along the lines I-I' and II-II' of FIG. 1 to illustrate a semiconductor device according to an embodiment of inventive concepts. In the following description of FIGS. 5A and 5B, a previously-described element may be identified by the same reference number without repeating an overlapping description thereof, for concise description.

Referring to FIGS. 1, 5A, and 5B, the first and second active patterns AP1 and AP2 may not include the channel layers CH, which are stacked to be spaced apart from each other in the third direction D3, unlike the first and second active patterns AP1 and AP2 previously described with reference to FIGS. 1, 2A, and 2B. The first and second active patterns AP1 and AP2 may include upper portions, each of which is shaped like a single fin protruding above the device isolation layer ST. The fin-shaped portion protruding above the device isolation layer ST may be provided between the first source/drain patterns SD1 or between the second source/drain patterns SD2 and may be defined as the channel layer CH. In other words, each of the transistors of the first and second cell regions PR and NR may be a fin field effect transistor.

An inhibition layer INH may be provided between the gate electrode GE and a gate spacer GS. The gate insulating layer GI including the gate oxide layer IL and the high-k dielectric layer HK may be provided between the gate electrode GE and the channel layer CH. As an example, the high-k dielectric layer HK may be locally provided on the gate oxide layer IL and may not be provided on the side surface of the gate electrode GE that is in contact with the inhibition layer INH. As another example, the high-k dielectric layer HK may be extended along a side surface INHs of the inhibition layer INH and may be provided in a space between the inhibition layer INH and the side surface of the gate electrode GE, as described with reference to FIG. 3B, but such a portion may be thinner than another portion of the high-k dielectric layer HK provided on the gate oxide layer IL.

FIGS. 6A, 7A, 10A, 13A, and 15A are plan views illustrating a method of fabricating a semiconductor device according to an embodiment of inventive concepts. FIGS. 6B, 7B, 8, 9, 10B, 11, 12, 13B, 14A, 15B, 16A, and 17A are sectional views, each of which is taken along a corresponding one of lines I-I' of FIGS. 6A, 7A, 10A, 13A, and 15A to illustrate a method of fabricating a semiconductor device according to an embodiment of inventive concepts. FIGS. 6C, 7C, 14B, 15C, 16B, and 17B are sectional views, each of which is taken along a corresponding one of lines II-II' of FIGS. 6A, 7A, 10A, 13A, and 15A to illustrate a method of fabricating a semiconductor device according to an embodiment of inventive concepts. Hereinafter, the fabricating method of the semiconductor device will be described in more detail with reference to the accompanying drawings.

Figure 6B:
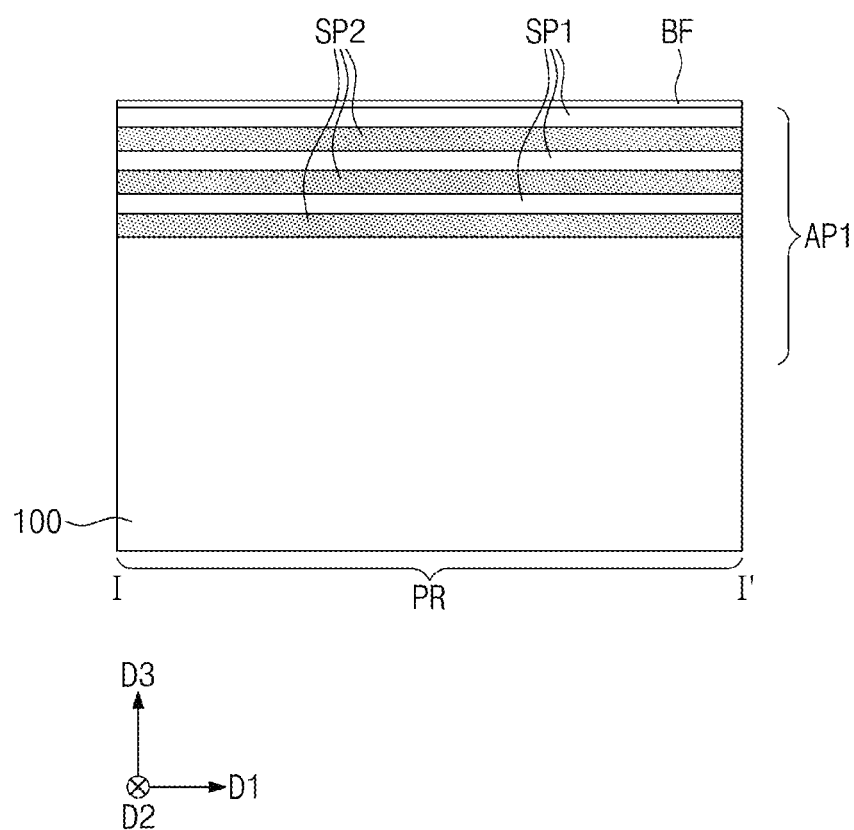
FIGS. 6B, 7B, 8, 9, 10B, 11, 12, 13B, 14A, 15B, 16A, and 17A are sectional views, each of which is taken along a corresponding one of lines I-I' of FIGS. 6A, 7A, 10A, 13A, and 15A to illustrate a method of fabricating a semiconductor device according to an embodiment of inventive concepts.
Figure 6C:
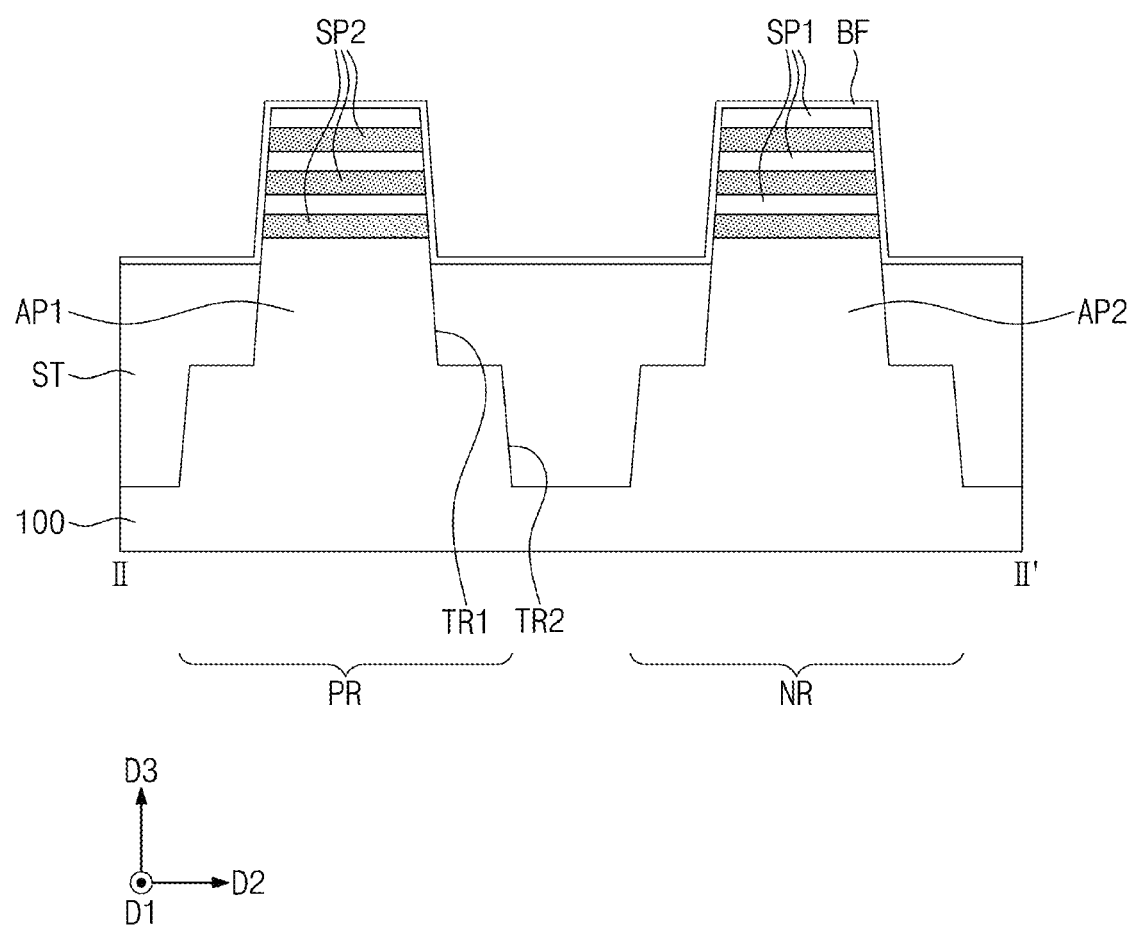
FIGS. 6C, 7C, 14B, 15C, 16B, and 17B are sectional views, each of which is taken along a corresponding one of lines II-II' of FIGS. 6A, 7A, 10A, 13A, and 15A to illustrate a method of fabricating a semiconductor device according to an embodiment of inventive concepts.

Referring to FIGS. 6A, 6B, and 6C, the substrate 100 may be provided, and in an embodiment, the substrate 100 may be provided in the form of a plate extended in the first and second directions D1 and D2 and may be formed of or include a semiconductor material. First and second semiconductor layers may be alternately stacked on the substrate 100. Each of the first and second semiconductor layers may be formed of or include at least one of silicon (Si), germanium (Ge), and silicon-germanium (SiGe), and in an embodiment, the materials of the first and second semiconductor layers may be different from each other. For example, the first semiconductor layers may be formed of or include silicon (Si), and the second semiconductor layers may be formed of or include silicon-germanium (SiGe).

A first patterning process may be performed on the substrate 100 to form the first trench TR1 defining the first active pattern AP1 and the second active pattern AP2. During the first patterning process, the first and second semiconductor layers may be patterned to form first semiconductor patterns SP1 and second semiconductor patterns SP2, respectively. The first and second semiconductor patterns SP1 and SP2 may be alternately stacked on each of the first and second active patterns AP1 and AP2.

A second patterning process may be performed on the substrate 100 to form the second trench TR2 defining the first and second cell regions PR and NR. The second trench TR2 may be formed to be deeper than the first trench TR1. The first and second active patterns AP1 and AP2 may be formed on the first and second cell regions PR and NR, respectively.

The device isolation layer ST may be formed on the substrate 100 to fill the first and second trenches TR1 and TR2. The device isolation layer ST may be formed of or include at least one of insulating materials (e.g., silicon oxide). The device isolation layer ST may be recessed to expose upper portions of the first and second active patterns AP1 and AP2. In an embodiment, the upper portions of the first and second active patterns AP1 and AP2 may protrude above the device isolation layer ST in the third direction D3.

A buffer layer BF may be formed to cover the upper portions of the first and second active patterns AP1 and AP2 protruding above the device isolation layer ST. The buffer layer BF may be extended to cover at least a portion of the top surface of the device isolation layer ST. The buffer layer BF may be formed of or include, for example, silicon oxide.

Figure 7A:
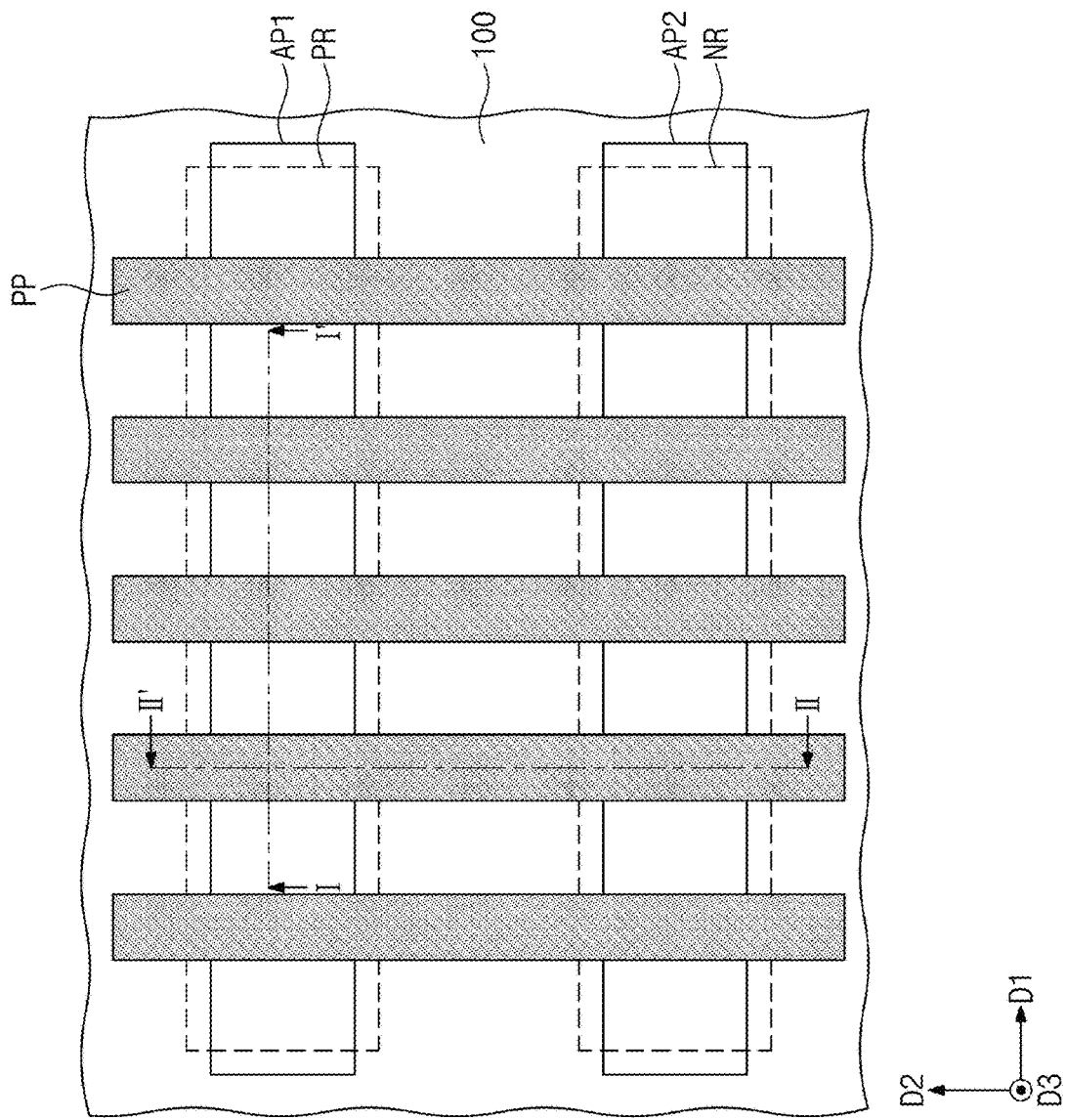
Figure 7B:
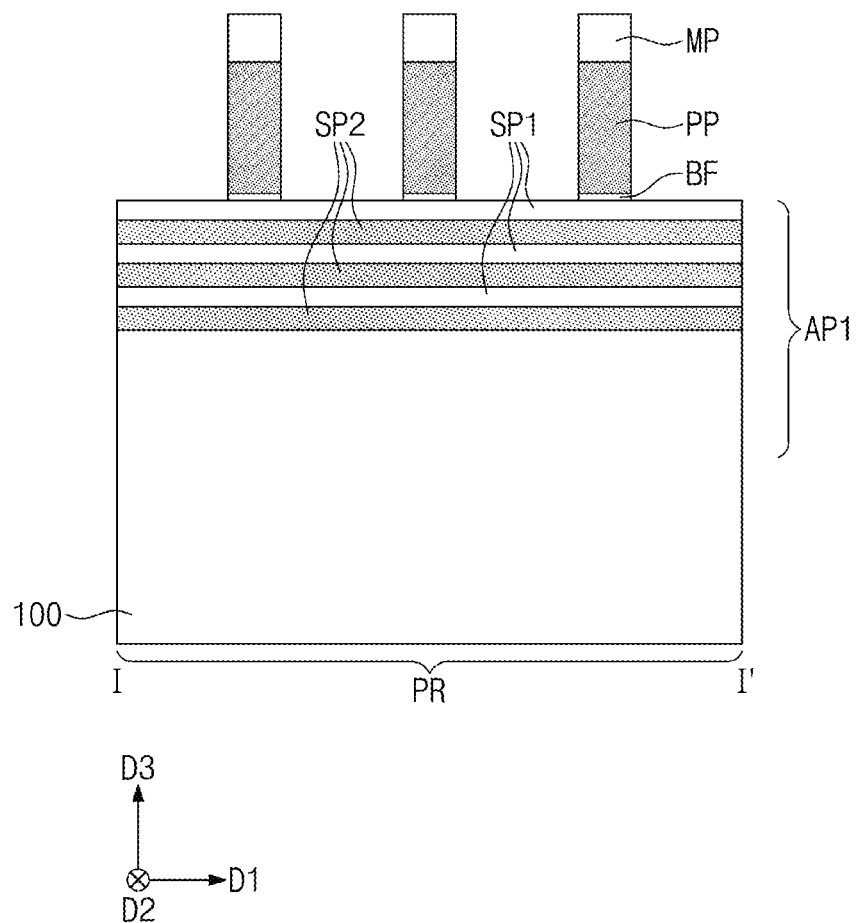
Figure 7C:
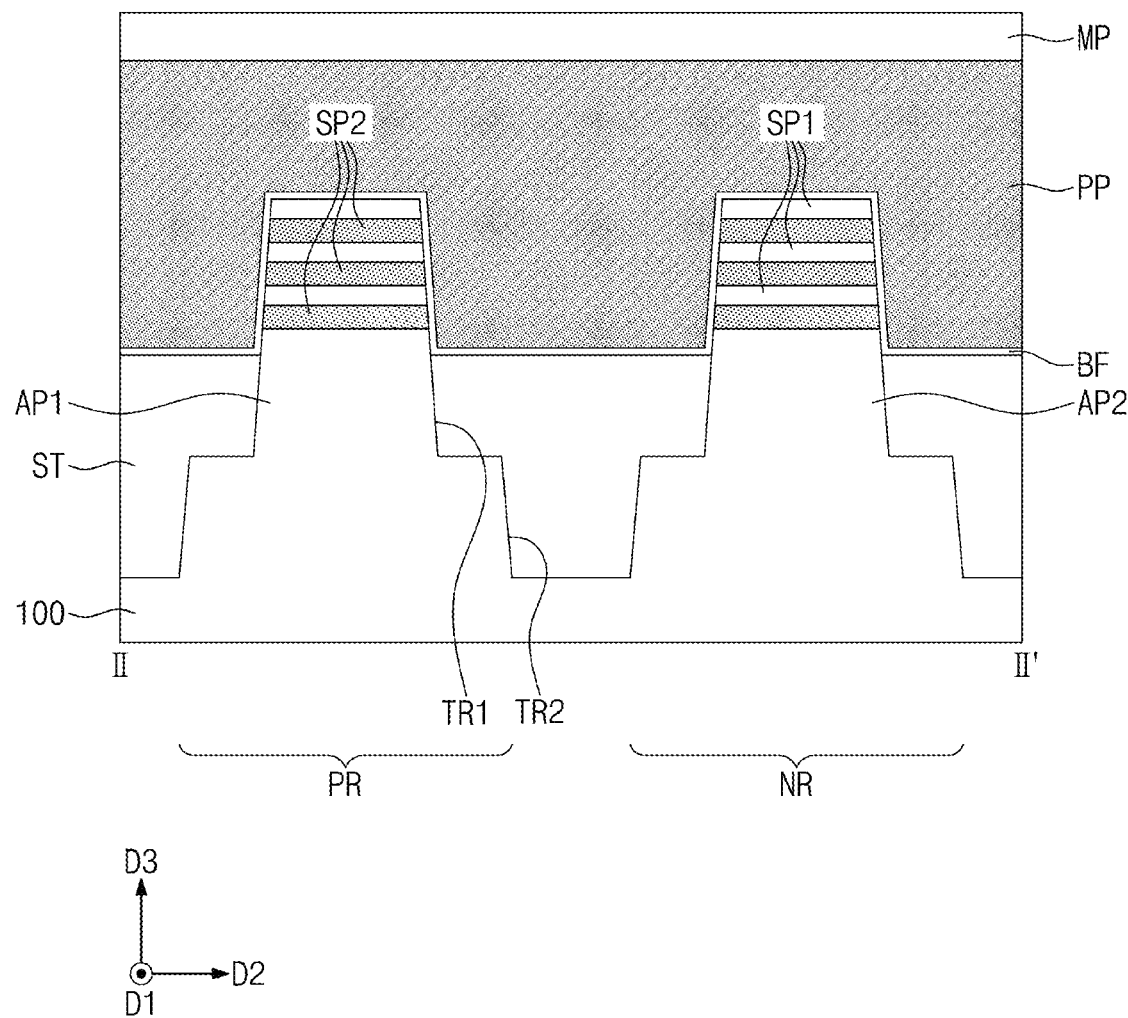

Referring to FIGS. 7A, 7B, and 7C, a sacrificial pattern PP may be formed to cross the first and second active patterns AP1 and AP2. The sacrificial pattern PP may be a line- or bar-shaped pattern extending in the second direction D2.

In detail, the formation of the sacrificial pattern PP may include forming a sacrificial layer on the substrate 100, forming a hard mask pattern MP on the sacrificial layer, and patterning the sacrificial layer and the buffer layer BF using the hard mask pattern MP as an etch mask. The sacrificial layer may be formed of or include, for example, poly silicon. The hard mask pattern MP may be formed of or include, for example, silicon nitride.

Figure 8:
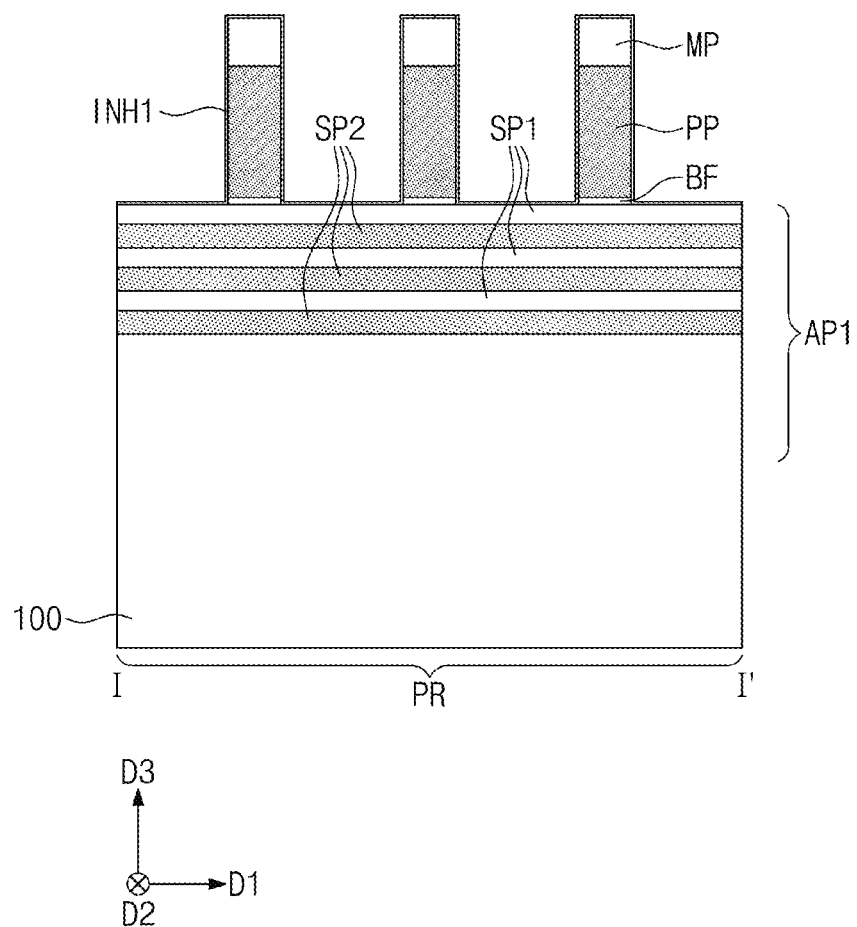

Referring to FIG. 8, the first inhibition layer INH1 may be formed to cover a top surface of the topmost one of the first semiconductor patterns SP1, a side surface of each of the buffer layer BF, the sacrificial pattern PP, and the hard mask pattern MP, and a top surface of the hard mask pattern MP.

Figure 9:
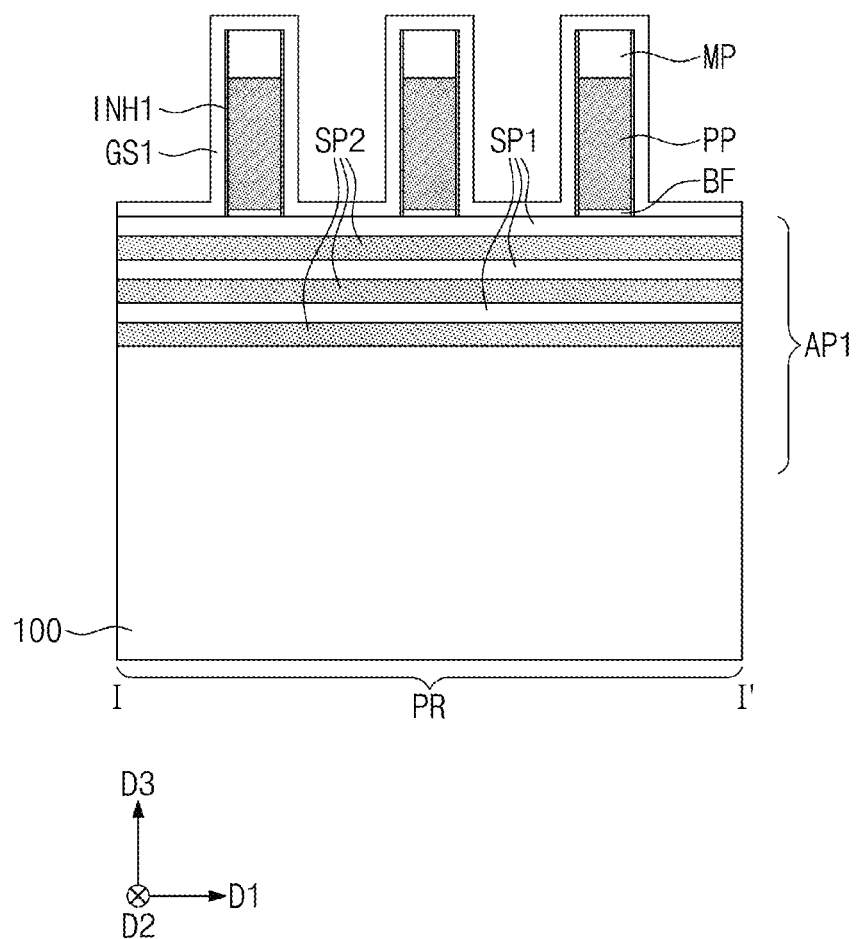

Referring to FIG. 9, an etch-back process may be performed to remove the first inhibition layer INH1 from the top surface of the topmost one of the first semiconductor patterns SP1 and the top surface of the hard mask pattern MP. Thus, the first inhibition layer INH1 may be locally left on a side surface of each of the buffer layer BF, the sacrificial pattern PP, and the hard mask pattern MP.

The first gate spacer GS1 may be formed to cover the top surface of the topmost one of the first semiconductor patterns SP1 and the top surface of the hard mask pattern MP, which are exposed to the outside by the etch-back process. The first gate spacer GS1 may be extended in the third direction D3 to cover the first inhibition layer INH1.

Figure 10A:
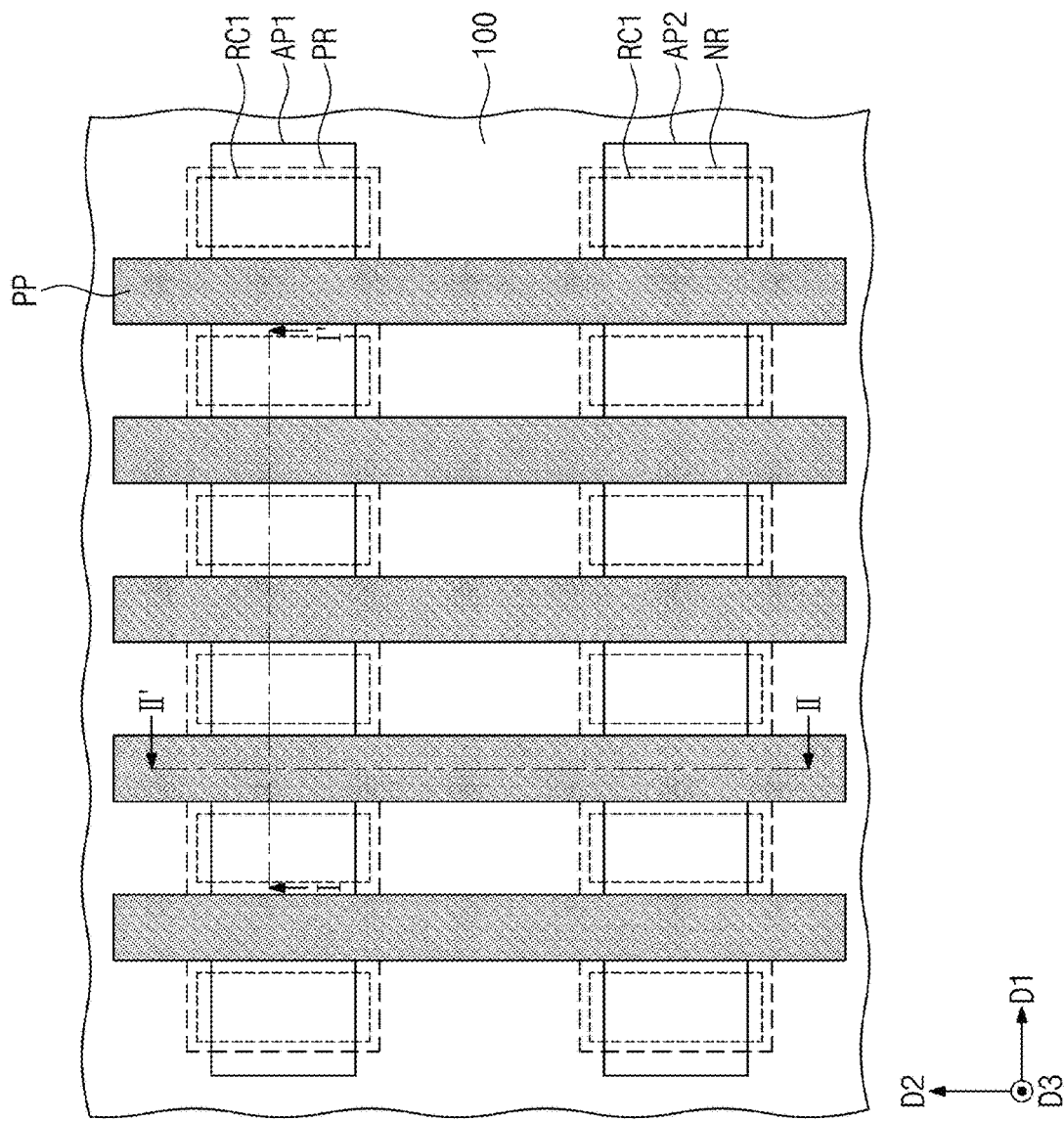
Figure 10B:
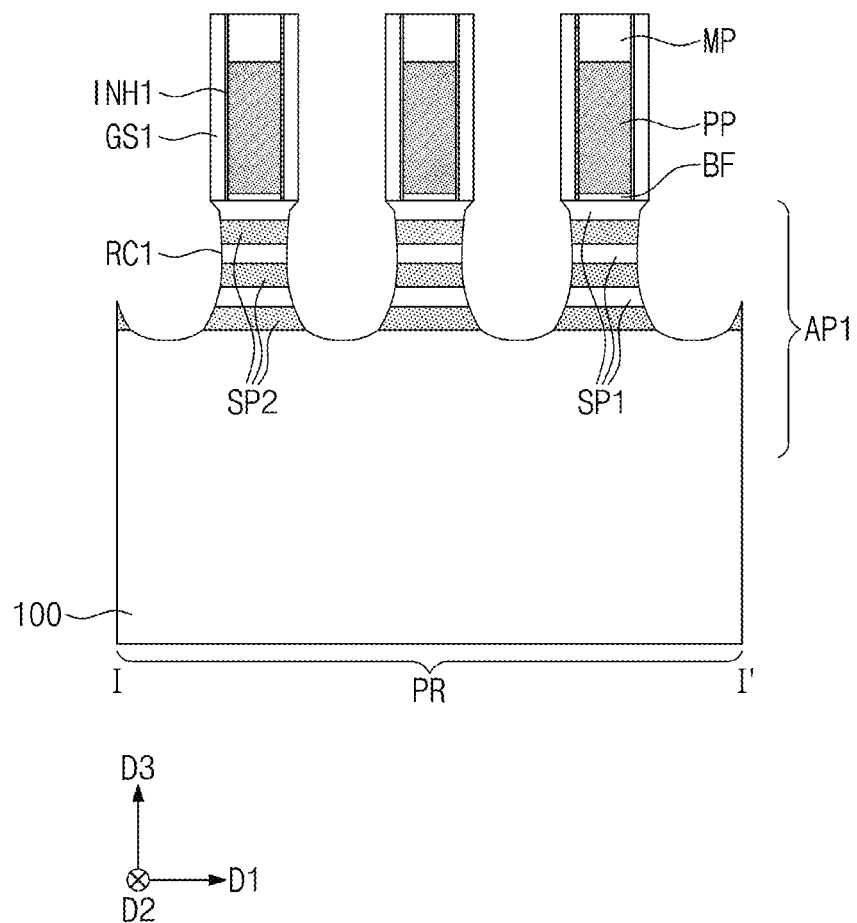

Referring to FIGS. 10A and 10B, the first gate spacer GS1 may be removed from the top surface of the hard mask pattern MP by an etching process. Unlike the illustrated structure, a portion of the hard mask pattern MP may also be removed during the etching process of the first gate spacer GS1. Accordingly, the first gate spacer GS1 may be locally left on the side surface of the first inhibition layer INH1.

Thereafter, each of the first and second active patterns AP1 and AP2 may be partially recessed to form first recess regions RC1. The first recess regions RC1 may be formed at both sides of the sacrificial pattern PP. The formation of the first recess regions RC1 may include etching an upper portion of each of the first and second active patterns AP1 and AP2 using the hard mask pattern MP and the first gate spacer GS1 as an etch mask. For example, each of the first recess regions RC1 may be overlapped with the first gate spacer GS1 in the third direction D3. However, inventive concepts are not limited to this example, and in an embodiment, each of the first recess regions RC1 may be locally formed in a region, which is located between adjacent ones of the sacrificial patterns PP but is not overlapped with the first gate spacer GS1 in the third direction D3.

Although not shown, at least a portion of the device isolation layer ST between the first and second cell regions PR and NR may be also be recessed, during the etching of the upper portion of each of the first and second active patterns AP1 and AP2.

Figure 11:
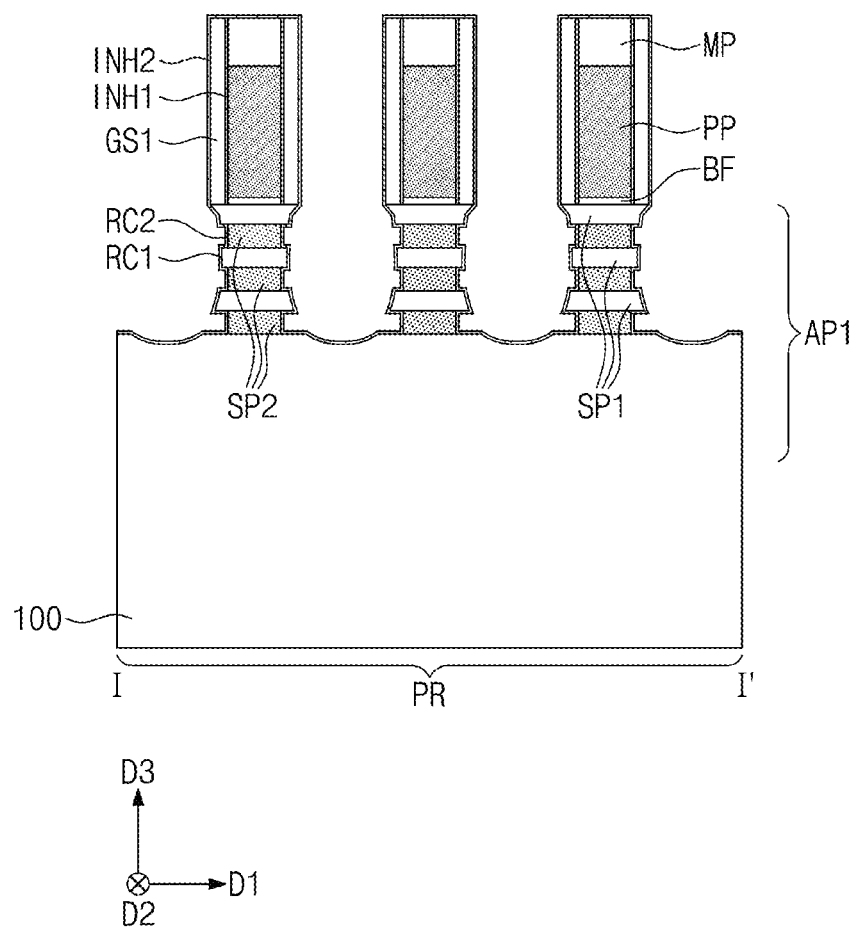

Referring to FIG. 11, each of the second semiconductor patterns SP2 may be partially recessed in the first direction D1 to form second recess regions RC2. The first semiconductor patterns SP1 exposed by the first recess regions RC1 may not be recessed, during the formation of the second recess regions RC2. For example, the second recess regions RC2 may be formed by an etching process, in which the second semiconductor patterns SP2 have a high etch selectivity (e.g., a faster etch rate) with respect to the first semiconductor patterns SP1.

Thereafter, the second inhibition layer INH2 may be formed to cover the top surfaces of the first and second active patterns AP1 and AP2 and the side surfaces of the first semiconductor patterns SP1, which are exposed by the first recess regions RC1, and the side surfaces of the second semiconductor patterns SP2, which are exposed by the second recess regions RC2. The second inhibition layer INH2 may be extended to cover the side and top surfaces of the first gate spacer GS1 and the top surface of the hard mask pattern MP.

Figure 12:
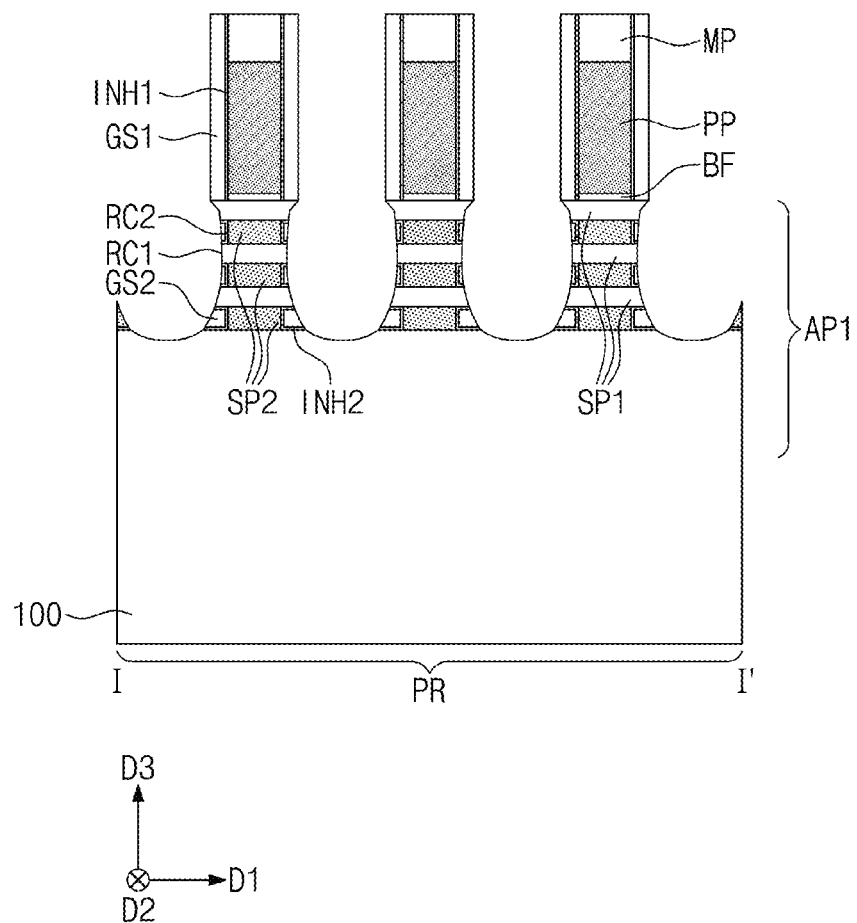

Referring to FIG. 12, the second gate spacer GS2 may be formed to fill each of the second recess regions RC2. The formation of the second gate spacer GS2 may include forming a second gate spacer layer to fill the second recess regions RC2 and at least a portion of the first recess regions RC1 and then performing an etch-back process to remove the second gate spacer layer from the first recess regions RC1.

A portion of the second inhibition layer INH2, which are formed outside the second recess regions RC2, may be removed during the etch-back process on the second gate spacer layer. In detail, the second inhibition layer INH2 may be removed from the side surfaces of the first semiconductor patterns SP1, the side and top surfaces of the first gate spacer GS1, and the top surface of the hard mask pattern MP and may be locally left in the second recess regions RC2.

Figure 13A:
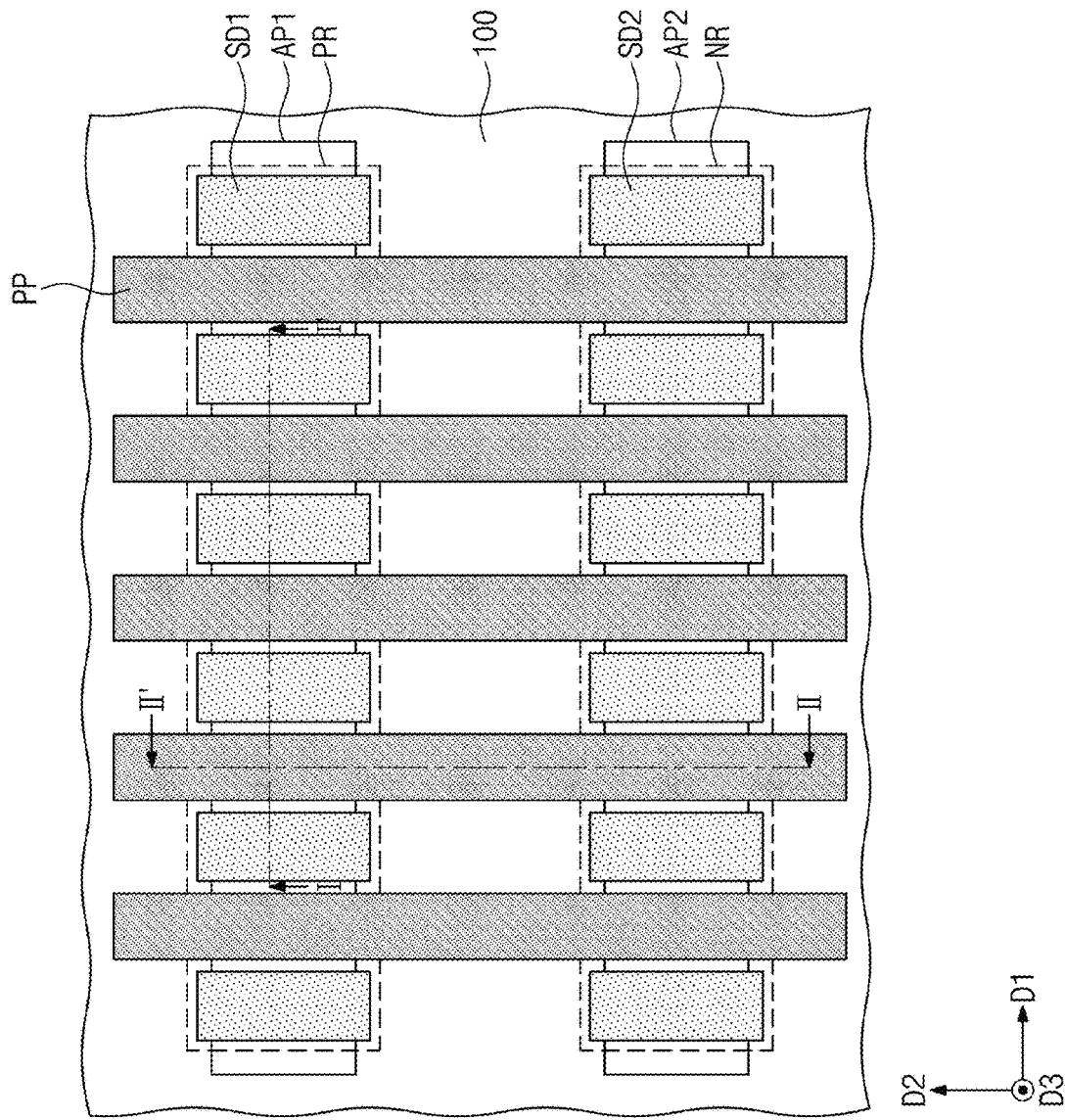
Figure 13B:
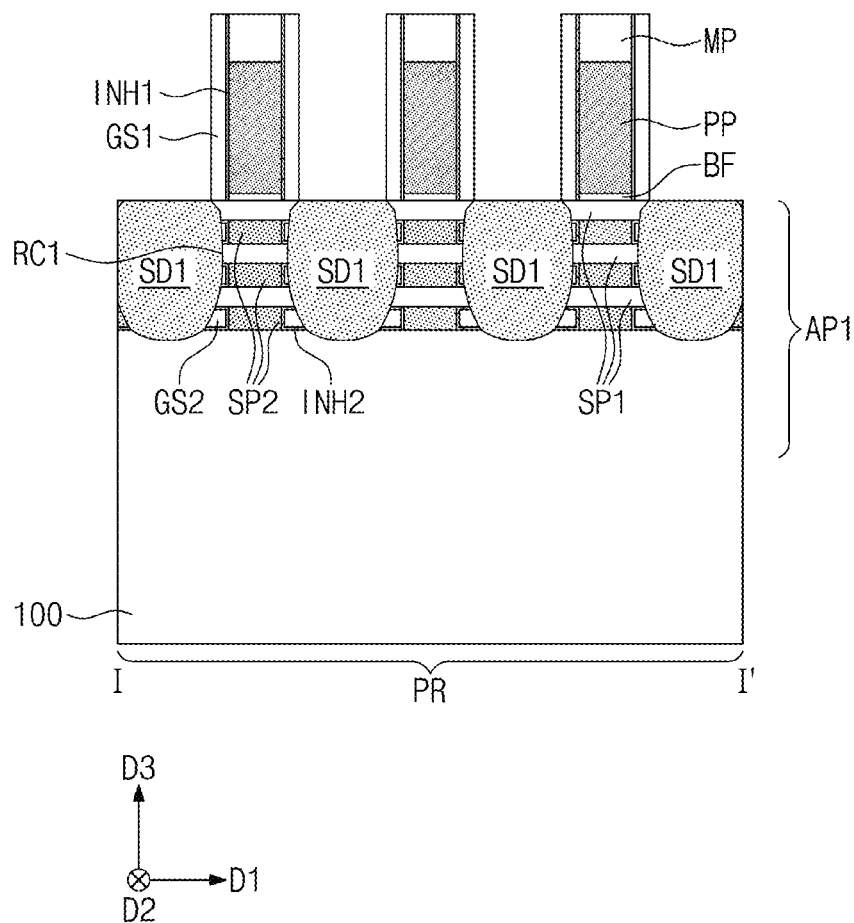

Referring to FIGS. 13A and 13B, the first source/drain patterns SD1 may be formed to fill the first recess regions RC1 in the upper portion of the first active pattern AP1, and the second source/drain patterns SD2 may be formed to fill the first recess regions RC1 in the upper portion of the second active pattern AP2. The first and second source/drain patterns SD1 and SD2 may be formed at both sides of the sacrificial pattern PP. The top surface of each of the first and second source/drain patterns SD1 and SD2 is illustrated to be substantially coplanar with the top surface of the topmost one of the first semiconductor patterns SP1, but inventive concepts are not limited to this example. For example, each of the first and second source/drain patterns SD1 and SD2 may be formed to have a top surface that is located at a level higher than the top surface of the topmost one of the first semiconductor patterns SP1.

The first and second source/drain patterns SD1 and SD2 may be formed by a selective epitaxial growth process, in which the inner side surface of the first recess region RC1 is used as a seed layer. The selective epitaxial growth process may include, for example, a chemical vapor deposition (CVD) process or a molecular beam epitaxy (MBE) process.

As an example, impurities may be injected into the first and second source/drain patterns SD1 and SD2 in an in-situ manner, during the selective epitaxial growth process to form the first and second source/drain patterns SD1 and SD2. As another example, impurities may be injected into the first and second source/drain patterns SD1 and SD2 after the formation of the first and second source/drain patterns SD1 and SD2. The first source/drain patterns SD1 may be doped to have the first conductivity type (e.g., p-type), and the second source/drain patterns SD2 may be doped to have the second conductivity type (e.g., n-type).

Figure 14A:
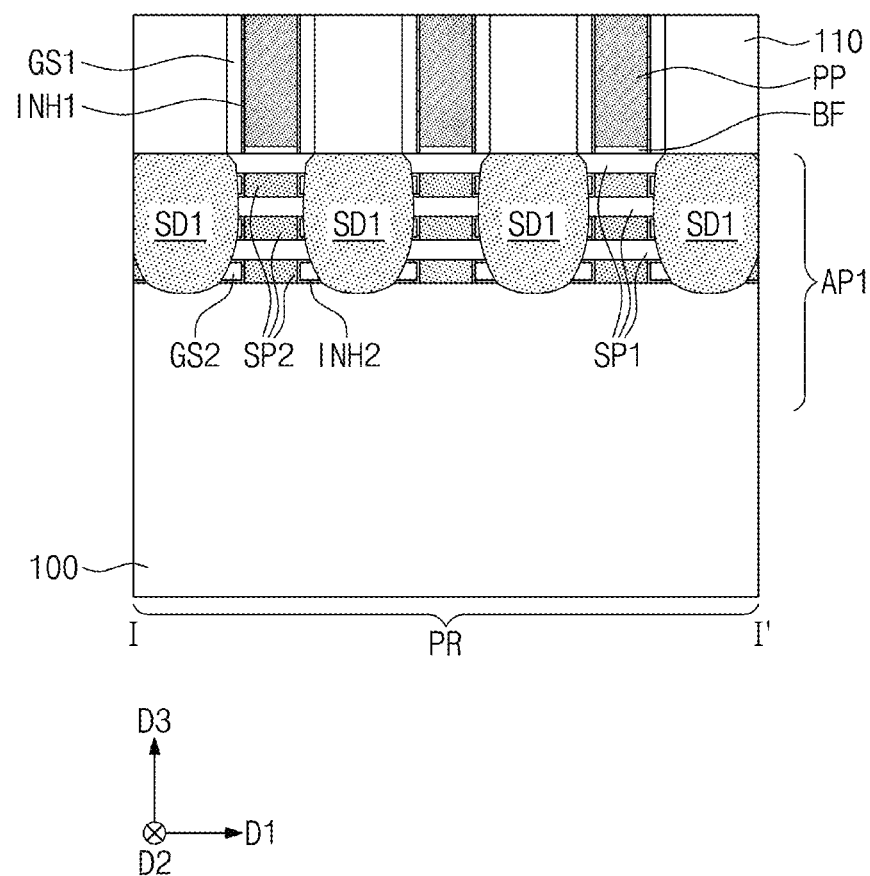
Figure 14B:
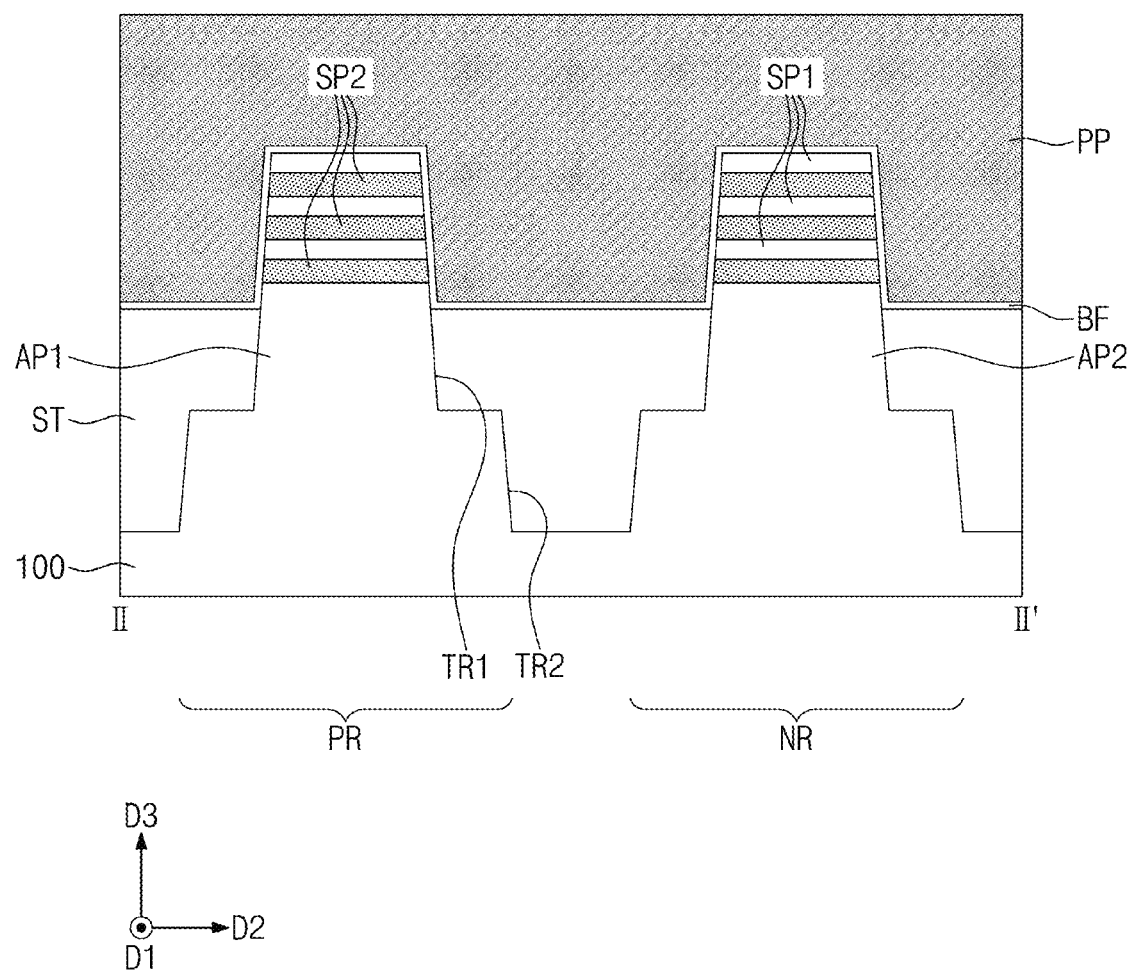

Referring to FIGS. 14A and 14B, the first interlayer insulating layer 110 may be formed to cover the first and second source/drain patterns SD1 and SD2, the hard mask pattern MP (e.g., see FIG. 13B), and the first gate spacer GS1.

Next, the first interlayer insulating layer 110 may be planarized to expose the top surface of the sacrificial pattern PP. The planarization of the first interlayer insulating layer 110 may be performed using an etch-back or chemical mechanical polishing (CMP) process. In an embodiment, the hard mask pattern MP (e.g., see FIG. 13B) may be completely removed during the planarization process. After the planarization process, the first interlayer insulating layer 110 may have a top surface that is substantially coplanar with the top surface of the sacrificial pattern PP and the top surface of the first gate spacer GS1.

Figure 15A:
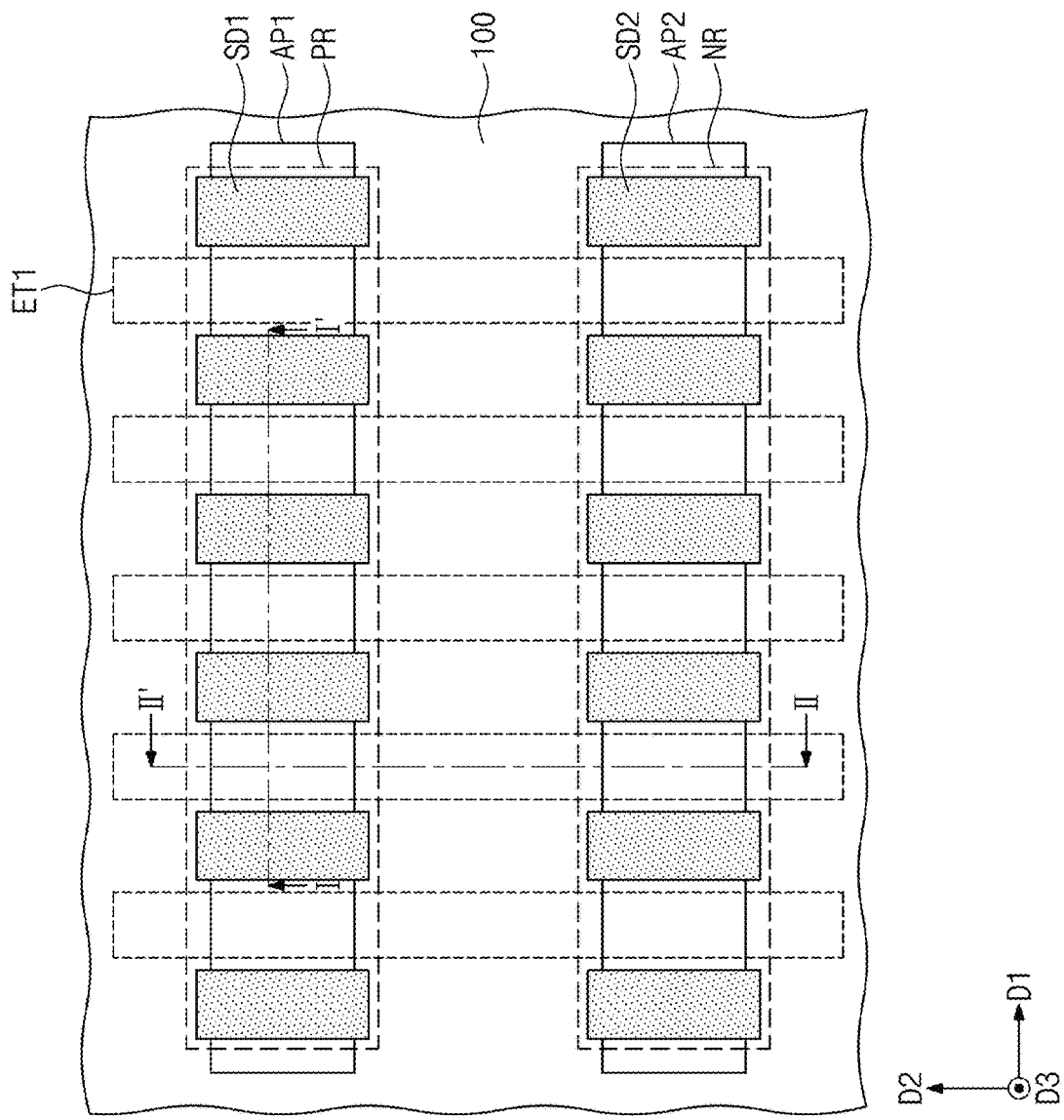
Figure 15B:
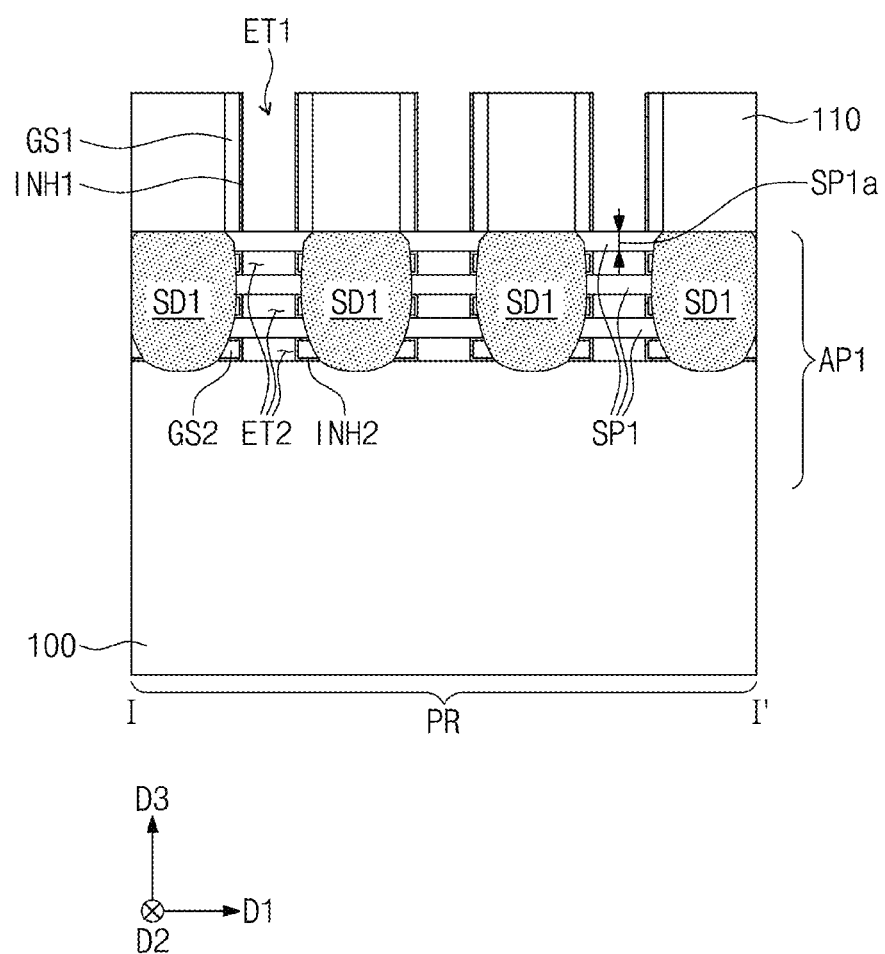
Figure 15C:
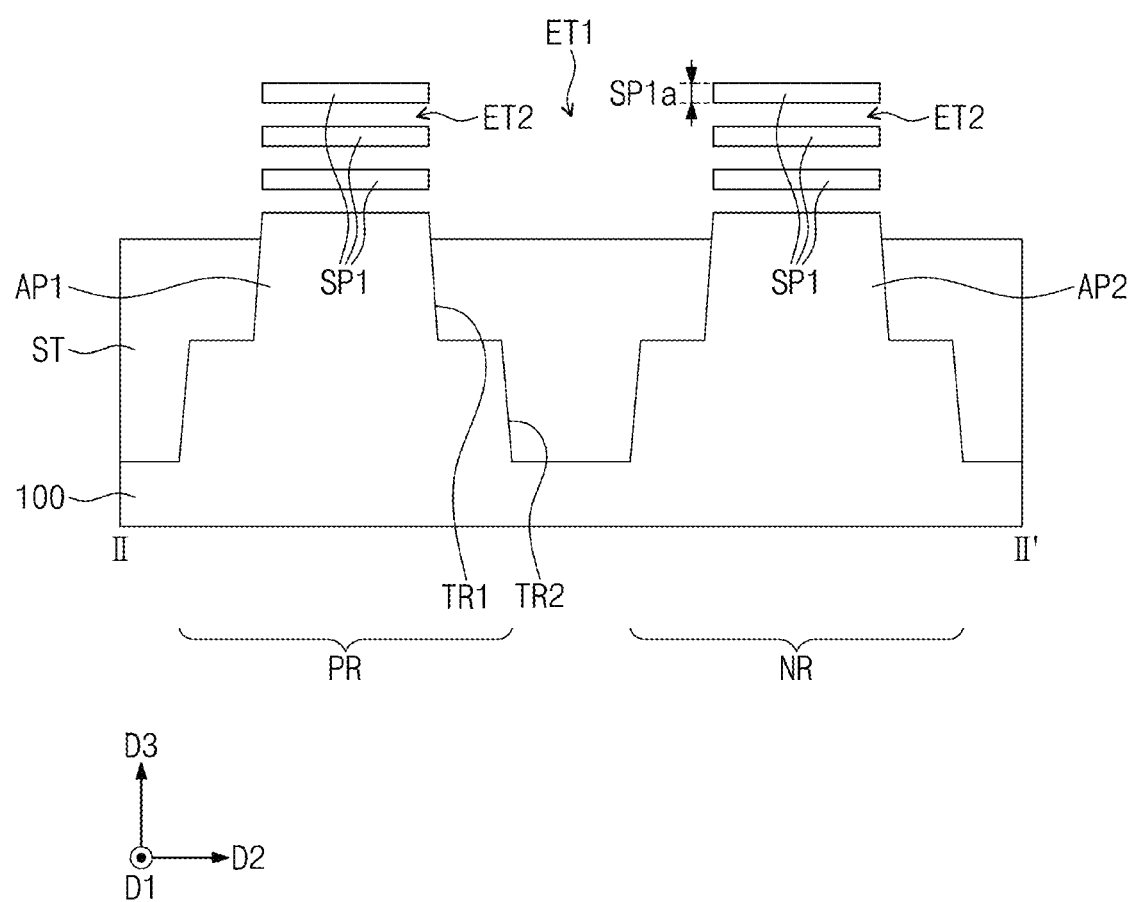

Referring to FIGS. 15A, 15B, and 15C, the sacrificial pattern PP (e.g., see FIGS. 14A and 14B) may be selectively removed. As a result of the removal of the sacrificial pattern PP, a first empty space ET1 may be formed to expose the first and second active patterns AP1 and AP2.

Thereafter, the second semiconductor patterns SP2 may be selectively removed to form second empty spaces ET2. In detail, the second semiconductor patterns SP2 may be exposed through the first empty space ET1. The second semiconductor patterns SP2 may be selectively removed by an etching process, in which the second semiconductor patterns SP2 have a high etch selectivity (e.g., a faster etch rate) with respect to the first semiconductor patterns SP1, and in this case, the first semiconductor patterns SP1 may not be removed. As a result of the removal of the second semiconductor patterns SP2, the second empty spaces ET2 may be formed between the first semiconductor patterns SP1. Each of the second empty spaces ET2 may be defined as a space between the first semiconductor patterns SP1, which are adjacent to each other in the third direction D3.

Figure 16A:
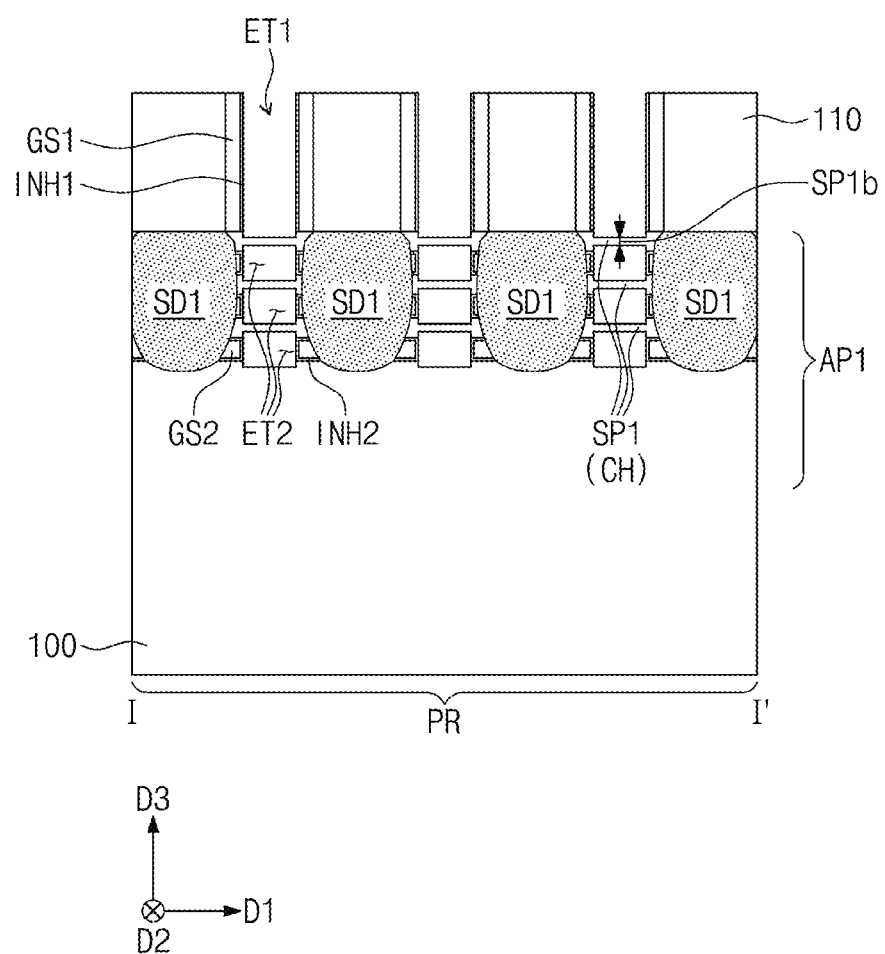
Figure 16B:
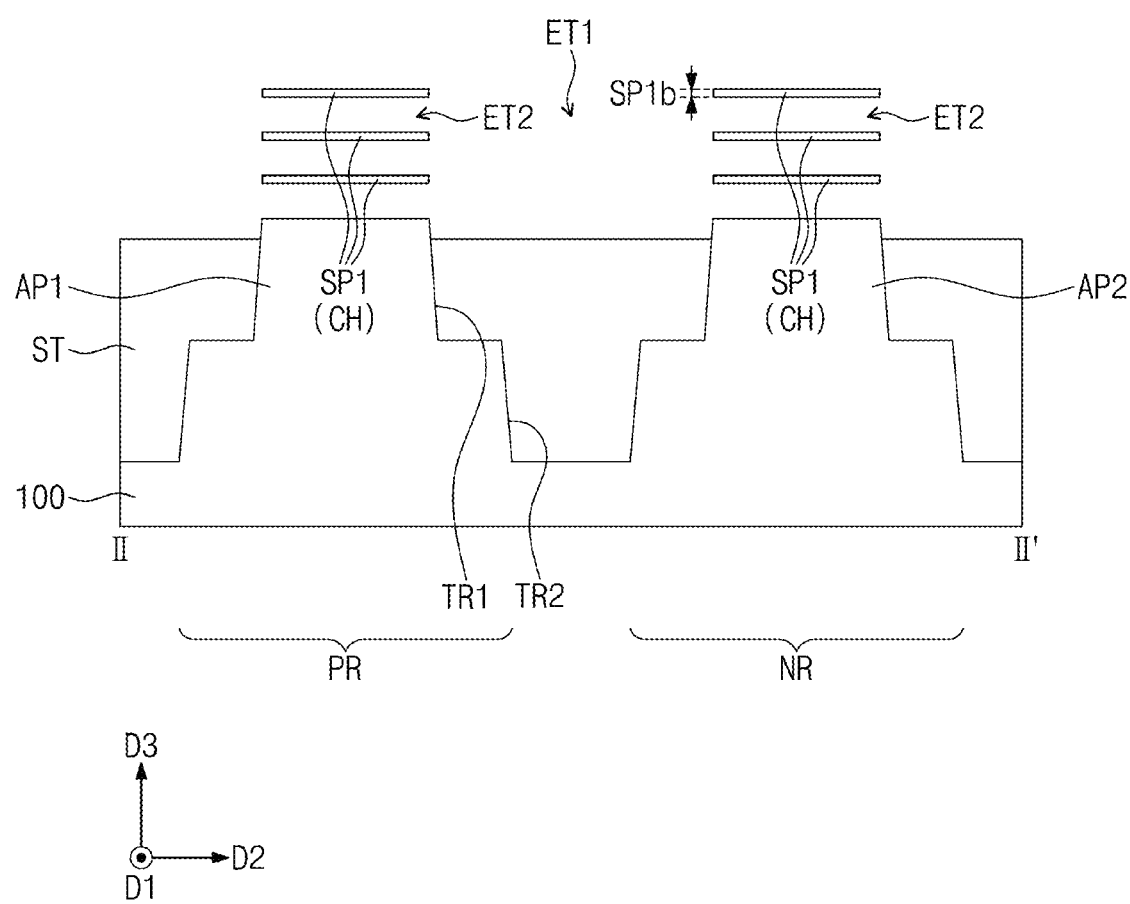

Referring to FIGS. 16A and 16B, a trimming process may be performed to partially etch each of the first semiconductor patterns SP1 exposed by the first empty space ET1 and the second empty spaces ET2. In each of the first semiconductor patterns SP1, the etched portion may be a portion that is not overlapped with the first and second gate spacers GS1 and GS2 and the first and second inhibition layers INH1 and INH2 in the third direction D3.

A thickness of each of the first semiconductor patterns SP1 in the third direction D3 may be smaller after the trimming process than before the trimming process; for example, SP1b in FIGS. 16A and 16B may be less than SP1a in FIGS. 15B and 15C.

Figure 17A:
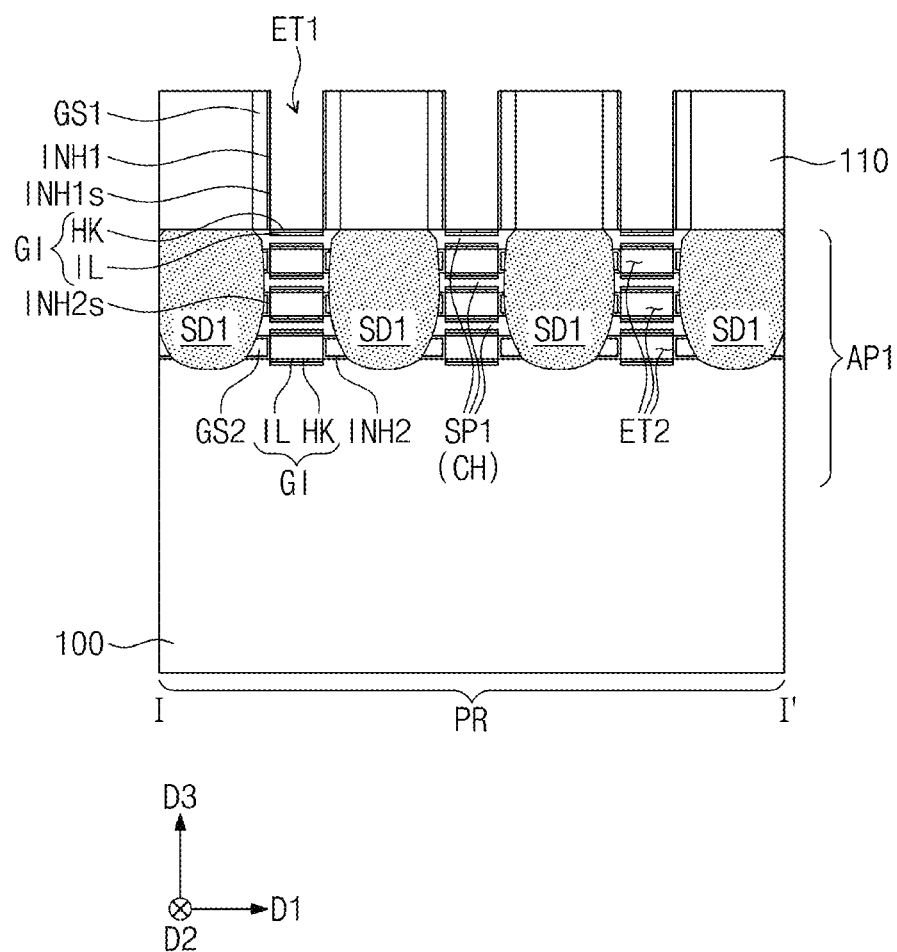
Figure 17B:
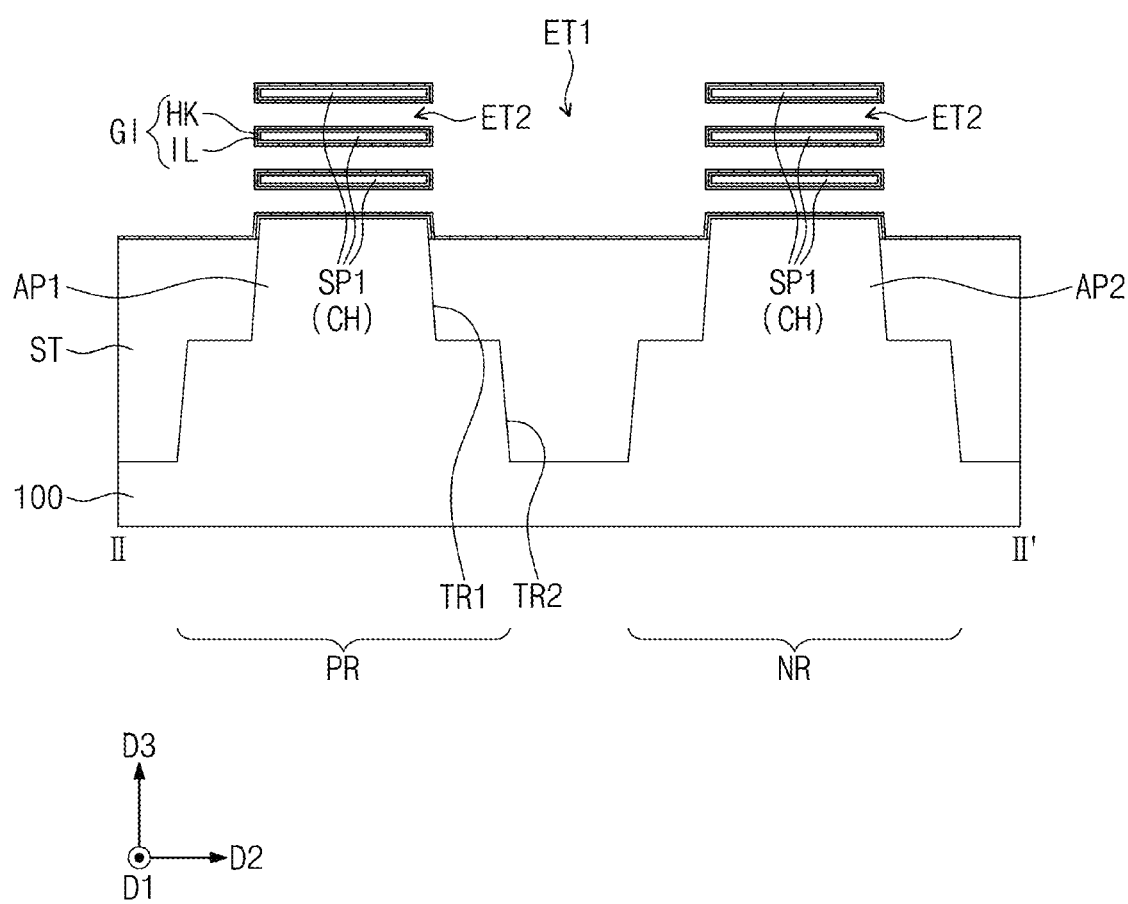

Referring to FIGS. 17A and 17B, the gate insulating layer GI may be formed in the first empty space ET1 and the second empty spaces ET2. In detail, the gate oxide layer IL may be formed in the first empty space ET1 and the second empty spaces ET2, and the high-k dielectric layer HK may be formed to cover the gate oxide layer IL.

The gate oxide layer IL may be formed to cover the top and bottom surfaces of the first semiconductor patterns SP1 exposed by the first and second empty spaces ET1 and ET2, when viewed in the sectional view of FIG. 17A. The gate oxide layer IL may be formed to surround the first semiconductor patterns SP1 exposed the first and second empty spaces ET1 and ET2, when viewed in the sectional view of FIG. 17B.

The high-k dielectric layer HK covering the gate oxide layer IL may be formed to have a uniform thickness by a selective atomic layer deposition (selective-ALD) process. The selective-ALD process may be performed such that the high-k dielectric layer HK is not formed on the side surfaces INH1s and INH2s of the first and second inhibition layers INH1 and INH2.

As a result of the trimming process described with reference to FIGS. 16A and 16B, the high-k dielectric layer HK may be formed to be overlapped with portions of the first semiconductor patterns SP1, but not with the first and second gate spacers GS1 and GS2 and the first and second inhibition layers INH1 and INH2, in the first direction D1.

Referring back to FIGS. 1, 2A and 2B, the second interlayer insulating layer 120 may be formed on the first interlayer insulating layer 110. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

The third interlayer insulating layer 130 may be formed on the active contacts AC and the gate contacts GC. A first metal layer may be formed in the third interlayer insulating layer 130, and in an embodiment, the first metal layer may include the first interconnection lines M1, the first via V1, and the second via V2.

According to an embodiment of inventive concepts, a semiconductor device may include a high-k dielectric layer, which is locally provided on a top or bottom surface of a gate electrode, and in this case, it may be possible to reduce a parasitic capacitance in the device and thereby to realize a low power consumption device.

In addition, according to an embodiment of inventive concepts, the semiconductor device may include a high-k dielectric layer, which is provided to have a relatively large thickness on the top or bottom surface of the gate electrode and to have a relatively small thickness on the side surface of the gate electrode, and even in this case, it may be possible to reduce a parasitic capacitance in the device and thereby to realize a low power consumption device.

While some example embodiments of inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate;
   an active pattern in an upper portion of the substrate and extending in a first direction;
   a gate electrode crossing the active pattern and extending in a second direction intersecting the first direction;
   a first gate spacer covering a side surface of the gate electrode;
   a first inhibition layer between the gate electrode and the first gate spacer; and
   a gate insulating layer between the gate electrode and the active pattern,
   wherein the gate insulating layer includes a high-k dielectric layer and a gate oxide layer, the gate oxide layer is between the high-k dielectric layer and the active pattern,
   wherein the high-k dielectric layer and the gate oxide layer do not overlap with the first inhibition layer and the first gate spacer in the first direction, and
   the high-k dielectric layer is locally provided between the gate oxide layer and the gate electrode such that the high-k dielectric layer does not extend between the first inhibition layer and a side surface of the gate electrode.

2. The semiconductor device of claim 1, wherein
   the active pattern comprises a plurality of channel layers,
   the plurality of channel layers are stacked on top of each other,
   the gate electrode surrounds the plurality of channel layers,
   each of the plurality of channel layers comprises first portions and a second portion between the first portions,
   each of the first portions are vertically overlapped by the first gate spacer,
   the second portion extends in the first direction and is vertically overlapped by the gate electrode, and
   a thickness of each of the first portions is larger than a thickness of the second portion.

3. The semiconductor device of claim 2, wherein the gate oxide layer and the high-k dielectric layer are in a space surrounded by inner side surfaces of the first portions and a top surface of the second portion.

4. The semiconductor device of claim 3, wherein the high-k dielectric layer covers a top surface of the gate oxide layer and contacts the inner side surfaces of the first portions.

5. The semiconductor device of claim 3, wherein
   the gate oxide layer conformally covers the inner side surfaces of the first portions and the top surface of the second portion, and
   the high-k dielectric layer is spaced apart from the plurality of channel layers with the gate oxide layer therebetween.

6. The semiconductor device of claim 5, wherein
   a top surface of the high-k dielectric layer has a first surface and a second surface,
   the first surface of the high-k dielectric layer is located at a level lower than a topmost surface of the gate oxide layer,
   the second surface is located at a level higher than the first surface of the high-k dielectric layer and is coplanar with the topmost surface of the gate oxide layer, and
   the gate electrode protrudes toward the second portion of each of the plurality of channel layers.

7. The semiconductor device of claim 3, wherein each of the inner side surfaces of the first portions is at an acute angle relative to the top surface of the second portion.

8. The semiconductor device of claim 3, wherein each of the inner side surfaces of the first portions is connected to the top surface of the second portion while having a continuously changing inclination angle.

9. The semiconductor device of claim 2, further comprising:
   a pair of source/drain patterns, which are provided at both sides of the gate electrode;
   a second gate spacer, which is vertically overlapped by the first gate spacer and each of the first portions of the plurality of channel layers, the second gate spacer being in contact with one source/drain pattern among the pair of source/drain patterns; and a second inhibition layer between the gate electrode and the second gate spacer, wherein the second inhibition layer is in direct contact with the gate electrode.

10. The semiconductor device of claim 9, wherein the second inhibition layer surrounds the second gate spacer and is in contact with one source/drain pattern among the pair of source/drain patterns.

11. The semiconductor device of claim 1, wherein a top surface of the high-k dielectric layer is at a level that is lower than or equal to a bottom surface of the first gate spacer.

12. A semiconductor device, comprising:
a substrate;
an active pattern in an upper portion of the substrate and extending in a first direction;
a gate electrode crossing the active pattern and extending in a second direction intersecting the first direction;
a first gate spacer covering a side surface of the gate electrode;
a first inhibition layer between the gate electrode and the first gate spacer; and
a gate insulating layer between the gate electrode and the active pattern,
wherein the gate insulating layer comprises a high-k dielectric layer and a gate oxide layer,
the gate oxide layer is between the high-k dielectric layer and the active pattern,
the high-k dielectric layer extends along a top surface of the gate oxide layer and a side surface of the first inhibition layer,
the high-k dielectric layer includes a first thickness on the top surface of the gate oxide layer and a second thickness on the side surface of the first inhibition layer,
the first thickness of the high-k dielectric layer is in a vertical direction and the second thickness of the high-k dielectric layer is in a horizontal direction crossing the vertical direction, and
the first thickness of the high-k dielectric layer is larger than the second thickness of the high-k dielectric layer.

13. The semiconductor device of claim 12, wherein
the active pattern comprises a plurality of channel layers,
the plurality of channel layers are stacked on top of each other,
the gate electrode surrounds the plurality of channel layers,
each of the plurality of channel layers comprises first portions and a second portion between the first portions,
each of the first portions is vertically overlapped by the first gate spacer, the second portion extends in the first direction and is vertically overlapped by the gate electrode, and
a thickness of each of the first portions is larger than a thickness of the second portion.

14. The semiconductor device of claim 13, further comprising:
a pair of source/drain patterns, which are provided at both sides of the gate electrode;
a second gate spacer, which is vertically overlapped by the first gate spacer and each of the first portions of the plurality of channel layers, the second gate spacer being in contact with one source/drain pattern among the pair of source/drain patterns; and
a second inhibition layer between the gate electrode and the second gate spacer, wherein the high-k dielectric layer includes a third thickness on a side surface of the second inhibition layer, and
the third thickness of the high-k dielectric layer is smaller than the first thickness of the high-k dielectric layer.

15. The semiconductor device of claim 14, wherein the high-k dielectric layer is spaced apart from the first gate spacer and the second gate spacer with the first inhibition layer or the second inhibition layer therebetween.

16. The semiconductor device of claim 14, wherein the second inhibition layer surrounds the second gate spacer and is in contact with one source/drain pattern among the pair of source/drain patterns.

17. The semiconductor device of claim 13, wherein the high-k dielectric layer covers the top surface of the gate oxide layer and is in contact with inner side surfaces of the first portions.

18. A semiconductor device, comprising:
a substrate;
an active pattern in an upper portion of the substrate and extending in a first direction, the active pattern including a plurality of channel layers stacked on top of each other;
a gate electrode crossing the active pattern and surrounding the plurality of channel layers, the gate electrode extending in a second direction intersecting the first direction;
a gate spacer covering a side surface of the gate electrode;
an inhibition layer between the gate electrode and the gate spacer;
a pair of source/drain patterns at both sides of the gate electrode;
a gate insulating layer between the gate electrode and each of the plurality of channel layers;
an interlayer insulating layer covering the gate electrode and the gate spacer;
active contacts, the active contacts penetrating the interlayer insulating layer and being connected respectively to the pair of source/drain patterns; and
a gate contact penetrating at least a portion of the interlayer insulating layer and connecting to the gate electrode, wherein
the gate insulating layer includes a high-k dielectric layer and a gate oxide layer,
the gate oxide layer is between the high-k dielectric layer and each of the plurality of channel layers,
the high-k dielectric layer and the gate oxide layer do not overlap with the inhibition layer and the gate spacer in the first direction, and
the high-k dielectric layer is locally provided between the gate oxide layer and the gate electrode such that the high-k dielectric layer does not extend between the inhibition layer and a side surface of the gate electrode.

19. The semiconductor device of claim 18, wherein
each of the plurality of channel layers has a pillar shape crossing the gate electrode and extending in the first direction, and
a cross section of each of the plurality of channel layers is circular, elliptical or rectangular.

20. The semiconductor device of claim 18, wherein
each of the plurality of channel layers comprises first portions and a second portion between the first portions,
each of the first portions is vertically overlapped by the gate spacer,
the second portion extends in the first direction and is vertically overlapped by the gate electrode, and a thickness of each of the first portions is larger than a thickness of the second portion.

\* \* \* \* \*